(12) United States Patent
Yamagata et al.

(10) Patent No.: US 8,915,096 B2
(45) Date of Patent: Dec. 23, 2014

(54) SILICA CONTAINER AND METHOD FOR PRODUCING THE SAME

(71) Applicant: Shin-Etsu Quartz Products Co., Ltd., Tokyo (JP)

(72) Inventors: Shigeru Yamagata, Narashino (JP); Tomomi Usui, New Delhi (IN)

(73) Assignee: Shin-Etsu Quartz Products Co., Ltd., Tokyo (JP)

( * ) Notice: Subject to any disclaimer, the term of this patent is extended or adjusted under 35 U.S.C. 154(b) by 39 days.

(21) Appl. No.: 13/793,948

(22) Filed: Mar. 11, 2013

(65) Prior Publication Data

US 2013/0227990 A1 Sep. 5, 2013

Related U.S. Application Data

(62) Division of application No. 13/055,865, filed as application No. PCT/JP2010/002049 on Mar. 24, 2010, now Pat. No. 8,420,192.

(30) Foreign Application Priority Data

May 26, 2009 (JP) .................................. 2009-126256

(51) Int. Cl.
C03B 19/00 (2006.01)
C03B 19/06 (2006.01)
C03C 17/02 (2006.01)
B32B 1/02 (2006.01)
C03B 19/09 (2006.01)
C30B 15/10 (2006.01)
C30B 29/06 (2006.01)
C30B 35/00 (2006.01)

(52) U.S. Cl.
CPC ............... *C03B 19/09* (2013.01); *C03B 19/095* (2013.01); *C30B 15/10* (2013.01); *C30B 29/06* (2013.01); *C30B 35/002* (2013.01)
USPC .............. 65/17.4; 65/17.5; 65/17.6; 428/34.6

(58) Field of Classification Search
USPC ......................... 428/34.4–34.6; 65/17.2–17.6
See application file for complete search history.

(56) References Cited

U.S. PATENT DOCUMENTS

| | | | |
|---|---|---|---|
| 4,935,046 | A | 6/1990 | Uchikawa et al. |
| 5,174,801 | A | 12/1992 | Matsumura et al. |

(Continued)

FOREIGN PATENT DOCUMENTS

| | | |
|---|---|---|
| JP | A-1-197381 | 8/1989 |
| JP | B2-4-22861 | 4/1992 |

(Continued)

OTHER PUBLICATIONS

Jun. 8, 2013 1$^{st}$ Office Action issued in Chinese Application No. 201080016990.8 with partial English-language translation.

(Continued)

*Primary Examiner* — Walter B Aughenbaugh
(74) *Attorney, Agent, or Firm* — Oliff PLC

(57) ABSTRACT

A method for producing a silica container includes forming a preliminarily molded substrate, wherein a first powdered raw material is fed to an inner wall of an outer frame having aspiration holes while rotating the outer frame; forming a preliminarily molded intermediate layer, wherein a second powdered raw material added with an aluminum compound or a crystal nucleating agent as an additive is fed to an inner wall of the preliminarily molded substrate; and forming an inner layer, wherein the preliminarily molded substrate and the preliminarily molded intermediate layer are degassed by aspiration from a peripheral side with heating from an inside forming a substrate and an intermediate layer, and a third powdered raw material having a high silica purity is spread from inside the substrate having the formed intermediate layer with heating from the inside forming an inner layer on an inner surface of the intermediate layer.

8 Claims, 6 Drawing Sheets

(56) References Cited

U.S. PATENT DOCUMENTS

| | | | |
|---|---|---|---|
| 5,885,071 | A | 3/1999 | Watanabe et al. |
| 5,976,247 | A | 11/1999 | Hansen et al. |
| 6,106,610 | A | 8/2000 | Watanabe et al. |
| 6,553,787 | B1 * | 4/2003 | Akiho et al. ............ 65/17.3 |
| 6,660,671 | B2 | 12/2003 | Werdecker et al. |
| 7,118,789 | B2 | 10/2006 | Kemmochi et al. |
| 8,733,127 | B2 * | 5/2014 | Yamagata et al. ............ 65/17.6 |
| 2003/0012898 | A1 | 1/2003 | Kemmochi et al. |
| 2003/0029195 | A1 | 2/2003 | Watanabe |
| 2010/0319608 | A1 | 12/2010 | Kanda |

FOREIGN PATENT DOCUMENTS

| | | |
|---|---|---|
| JP | A-5-105577 | 4/1993 |
| JP | B2-7-29871 | 4/1995 |
| JP | A-7-206451 | 8/1995 |
| JP | A-7-277743 | 10/1995 |
| JP | A-7-277744 | 10/1995 |
| JP | A-9-255476 | 9/1997 |
| JP | A-10-25184 | 1/1998 |
| JP | A-11-171684 | 6/1999 |
| JP | B2-3046545 | 5/2000 |
| JP | B2-3100836 | 10/2000 |
| JP | A-2002-362932 | 12/2002 |
| JP | A-2003-95678 | 4/2003 |
| JP | A-2004-131380 | 4/2004 |
| JP | A-2009-84113 | 4/2009 |

OTHER PUBLICATIONS

Apr. 26, 2013 Korean Office Action issued in Korean Application No. 10-2011-7026489 with partial English-language translation.

Dodd et al., "Optical determination of OH in fused silica," Journal of Applied Physics, 1966, pp. 3911, vol. 37.

Nasu et al., "Gas release of various kinds of vitreous silica," Journal of Illuminating Engineering Institute of Japan, 1990, pp. 595-600, vol. 74—No. 9.

Khotimchenko et al., "Determining the content of hydrogen dissolved in quartz glass using the methods of Raman scattering and mass spectrometry," Journal of Applied Spectroscopy, 1987, pp. 632-635, vol. 46—No. 6.

International Search Report mailed May 25, 2010 issued in International Patent Application No. PCT/JP2010/002049 (with translation).

Nov. 22, 2013 The $2^{nd}$ Office Action issued in Chinese Application No. 201080016990.8 with partial English-language translation.

Jun. 20, 2013 Taiwanese Search Report issued in Taiwanese Application No. 099109441 with English-language translation.

* cited by examiner

SILICA CONTAINER AND METHOD FOR PRODUCING THE SAME

This is a Division of application Ser. No. 13/055,865 filed Jan. 25, 2011, now granted U.S. Pat. No. 8,420,192, which in turn is a National Phase of Application No. PCT/JP2010/002049 filed Mar. 24, 2010. The disclosure of the prior applications is hereby incorporated by reference herein in its entirety.

TECHNICAL FIELD

The present invention relates to a silica container mainly comprised of a silica and to a method for producing it, and in particular, relates to a silica container with a low cost, a high dimensional precision, and a high durability and to a method for producing it.

BACKGROUND ART

A silica glass is used for a lens, a prism and a photomask of a photolithography instrument in manufacturing of a large-scale integrated circuit (LSI), for a TFT substrate used for display, for a tube of a ultraviolet lamp or an infrared lamp, for a window material, for a reflection plate, for a cleaning container in a semiconductor industry, for a container for melting of a silicon semiconductor, and so forth. However, an expensive compound such as silicon tetrachloride must be used as a raw material for a silica glass used in these silica articles; on top of that, melting temperature and processing temperature of a silica glass is extraordinary high (about 2000° C.), thereby leading to a high energy consumption, and this in turn to causing enormous emission of carbon dioxide, which is considered to be one of the global warming gases. Accordingly, from the past, a method for producing a silica glass at relatively low temperature by using a relatively cheap raw material has been sought.

For example, in Patent Document 1, a method (sol-gel method) in which a silicon alkoxide is hydrolyzed to a silica sol, which is then gelated to a wet gel, then to a dry gel by drying, and finally to a transparent silica glass body by firing at high temperature is disclosed. In Patent Document 2, a method in which a transparent silica glass is obtained by a sol-gel method from a silica sol mixture solution formed of tetramethoxy silane or tetraethoxy silane and a silica sol solution containing silica fine particles is disclosed. In Patent Document 3, a method for producing a transparent silica glass by using a silicon alkoxide and silica glass fine particles as its main raw materials, wherein a heating process at the temperature range of 200 to 1300° C. is carried out under an oxygen gas-containing atmosphere, a further heating process to 1700° C. or higher is carried out under a hydrogen gas-containing atmosphere, and a heating process between the foregoing two heating processes is carried out under a reduced pressure atmosphere, is disclosed. In these sol-gel methods, however, not only there were problems in a dimensional precision and a durability of the produced silica glass but also production cost thereof was not so cheap.

In Patent Document 4, a method (slip casting method), wherein at least two different kinds of silica glass particles, for example, silica glass fine particles and silica glass granules are mixed to obtain a water-containing suspension solution, which is then press molded and sintered at high temperature to obtain a silica-containing composite body, is disclosed. In Patent Document 5, a method, wherein a mixed solution (slurry) containing silica glass particles having the size of 100 μm or less and silica glass granules having the size of 100 μm or more is prepared, then the slip is cast into a molding frame, dried, and then sintered to obtain an opaque silica glass composite material, is disclosed. In these conventional slip casting methods, however, shrinkage of a molded article in drying and sintering processes is so large that a thick silica glass article with a high dimensional precision could not be obtained.

Accordingly, there are problems as mentioned above in the method for producing a silica glass article from a powdered raw material. Therefore, as a method for producing a silica crucible for manufacturing of a single crystal silicon used for LSI, methods disclosed in Patent Document 6 and Patent Document 7 are being used still today. In these methods, after a powdered natural quartz or a powdered synthetic cristobalite, which are ultra highly purified, is fed into a rotating mold made of carbon and then molded, carbon electrodes are inserted from the top and then electrically charged to cause arc discharge thereby raising the atmospheric temperature to a temperature range for melting of the powdered quartz (estimated temperature in the range from about 1800 to about 2100° C.) so that the powdered raw quartz may be melted and sintered.

In these methods, however, there has been a problem of a high cost because a highly purified powdered quartz is used. In addition, when a silica crucible is produced by a conventional method for manufacturing of a silica glass article and then used for growing of a silicon single crystal, there has been a problem such that much of gaseous bubbles are incorporated into a grown silicon single crystal.

In Patent Document 8, a silica crucible formed of three layers of an outer layer comprised of a natural quartz glass, an intermediate layer comprised of a synthetic quartz glass containing aluminum in high concentration, and an inner layer comprised of a high purity synthetic quartz glass, obtained from a powdered silica raw material by an arc-discharge melting method is described (the melting seems to be carried out under an air atmosphere). In it, prevention effect of impurity migration by the intermediate layer is shown.

However, this prevention effect of impurity migration is small; accordingly, when an alkali metal element such as Li, Na, and K is contained in high concentration in the outer layer, it has been difficult to suppress diffusion of these elements significantly.

In Patent Document 9, a technology to reduce gaseous bubbles in a wall of a melted quartz crucible by aspiration from a peripheral of a molding frame at the time of an arc-discharge melting of a molded article of a powdered silica raw material is shown.

However, dissolved gases in a wall of a melted quartz crucible could not be removed completely by mere aspiration of an air present in the powdered silica. It was only possible to produce a crucible containing a large quantity of residual gases, in particular, $O_2$ and $H_2O$.

In Patent Document 10, a silica crucible formed of three layers containing an inner layer comprised of a semitransparent quartz glass produced by an arc-discharge melting method is shown.

However, when a single crystal silicon is pulled up by using this three-layered crucible, there has been a problem of forming a defect such as a void and a pinhole in the pulled-up single crystal silicon and the other problems.

CITATION LIST

Patent Document

Patent Document 1: Japanese Patent Application Laid-Open Publication No. H07-206451
Patent Document 2: Japanese Patent Application Laid-Open Publication No. H07-277743
Patent Document 3: Japanese Patent Application Laid-Open Publication No. H07-277744
Patent Document 4: Japanese Patent Application Laid-Open Publication No. 2002-362932
Patent Document 5: Japanese Patent Application Laid-Open Publication No. 2004-131380
Patent Document 6: Japanese Examined Patent Application Publication No. H04-22861
Patent Document 7: Japanese Examined Patent Application Publication No. H07-29871
Patent Document 8: Japanese Patent Application Laid-Open Publication No. H09-255476
Patent Document 9: Japanese Patent Application Laid-Open Publication No. H10-25184
Patent Document 10: Japanese Patent Application Laid-Open Publication No. H11-171684

SUMMARY OF THE INVENTION

Technical Problem to be Solved by the Invention

The present invention is made in view of the problems as mentioned above, and has an object to provide a method for producing a silica container with a high dimensional precision, a high durability, and suppressed gas release, mainly comprised of a silica, by using a cheap and relatively low grade powdered silica as a main raw material with a reduced energy consumption and a low production cost, and to provide a silica container as mentioned above.

Solution to Problem

The present invention was made in order to solve the problems as mentioned above and provides a method for producing a silica container including at least a substrate comprised of a silica as its main component and having a rotational symmetry, an intermediate layer formed on an inner wall of the substrate, and an inner layer formed on an inner wall of the intermediate layer, wherein the method comprises:

a step of preparing a first powdered raw material, silica particles, for forming the substrate, a step of adding, as an additive, at least any one of an aluminum compound and a powdered compound capable of becoming a crystal nucleating agent for crystallization of a silica glass, into a second powdered raw material, silica particles, for forming the intermediate layer, a step of forming a preliminarily molded substrate, wherein the first powdered raw material is fed to an inner wall of an outer frame having a rotational symmetry and aspiration holes arranged splittingly in the inner wall while rotating the outer frame thereby preliminarily molding to an intended shape in accordance with the inner wall of the outer frame, a step of forming a preliminarily molded intermediate layer, wherein the second powdered raw material added with the additive is fed to an inner wall of the preliminarily molded substrate thereby preliminarily molding to an intended shape in accordance with the inner wall of the preliminarily molded substrate, a step of forming the substrate and the intermediate layer, wherein the preliminarily molded substrate and the preliminarily molded intermediate layer are degassed by aspiration from a peripheral side of the preliminarily molded substrate through the aspiration holes formed in the outer frame and at the same time heated from inside the preliminarily molded substrate and the preliminarily molded intermediate layer by a discharge-heat melting method thereby making a peripheral part of the preliminarily molded substrate to a sintered body while an inner part of the preliminarily molded substrate and the preliminarily molded intermediate layer to a fused glass body, and a step of forming the inner layer on an inner surface of the intermediate layer, wherein a third powdered raw material comprised of a crystalline silica and having a higher silica purity than the first powdered raw material is spread from inside the substrate having the formed intermediate layer and at the same time heated from the inside by a discharge-heat melting method.

If the method for producing a silica container includes the steps as mentioned above, gases (gas molecules) dissolved in the produced silica container can be suppressed. Because of this, gas molecules released from the silica container upon its use can be suppressed, thereby enabling to decrease a harmful effect caused by gas molecules to a material accommodated in the silica container. In addition, a silica container, having a high dimensional precision and a high durability, capable of fully avoiding impurity contamination to a material accommodated therein can be produced with a low energy consumption, a high productivity, and a low cost, even though a raw material with a low purity is used for the substrate.

In this case, it is preferable that an atmospheric gas in the step of forming the substrate and the intermediate layer from the preliminarily molded substrate and the preliminarily molded intermediate layer be made to a gas mixture comprised of an inert gas as its main component and 1% or more by volume of an $H_2$ gas.

If the atmospheric gas in the step of forming the substrate and the intermediate layer from the preliminarily molded substrate and the preliminarily molded intermediate layer is made to a gas mixture comprised of an inert gas as its main component and 1% or more by volume of a hydrogen gas, among the gases dissolved in the produced substrate, in particular, amounts of an $H_2O$ molecule and an $O_2$ molecule dissolved in the substrate can be reduced effectively.

In the method for producing a silica container of the present invention, the atmospheric gas in the step of forming the inner layer can be made to a gas mixture comprised of an inert gas as its main component and an $O_2$ gas in the range from 1 to 30% by volume.

When the atmospheric gas in the step of forming the inner layer is made to a gas mixture comprised of an inert gas as its main component and an $O_2$ gas in the range from 1 to 30% by volume, the inner layer containing small amount of fine particles of carbon (C) can be obtained.

In addition, in the method for producing a silica container of the present invention, the atmospheric gas in the step of forming the inner layer can be made to a gas mixture comprised of an inert gas as its main component and an $H_2$ gas in the range from 1 to 30% by volume.

When the atmospheric gas in the step of forming the inner layer is made to a gas mixture comprised of an inert gas as its main component and an $H_2$ gas in the range from 1 to 30% by volume, among the gases dissolved in the produced silica container, in particular, amounts of an $H_2O$ molecule and an $O_2$ molecule dissolved in the inner layer can be reduced effectively.

In the method for producing a silica container of the present invention, a silica purity of the first powdered raw material can be made in the range from 99.9 to 99.999% by weight.

In the method for producing a silica container of the present invention, even if a silica purity of the first powdered raw material is made relatively low, in the range from 99.9 to 99.999% by weight, impurity contamination to a material accommodated therein can be fully avoided. Accordingly, the powdered raw material can be prepared very cheaply.

It is preferable that the method have a step of adding at least one element of Ca, Sr, and Ba into the third powdered raw material with the total element concentration of Ca, Sr, and Ba contained therein being in the range from 50 to 5000 ppm by weight.

In addition, it is preferable that the method further have a step of forming a coating layer containing at least one element of Ca, Sr, and Ba on an inner surface side of the inner layer with the total element concentration of Ca, Sr, and Ba contained in the coating layer being in the range from 5 to 500 $\mu g/cm^2$.

When at least any one of a step of adding at least one element of Ca, Sr, and Ba into the third powdered raw material with the total element concentration being in the range from 50 to 5000 ppm by weight and a step of forming a coating layer containing at least one element of Ca, Sr, and Ba on an inner surface side of the inner layer with the total element concentration of Ca, Sr, and Ba being in the range from 5 to 500 $\mu g/cm^2$ is executed, the inner layer is recrystallized upon use of the produced silica container at such high temperature as in the range from 1300 to 1600° C., thereby enabling to further reduce impurity contamination to a material accommodated therein and at the same time enabling to suppress etching and dissolution of surface of the inner layer.

In addition, according to the method for producing a silica container in the present invention, it is possible to use the silica container as a crucible for pulling up of a silicon single crystal.

Accordingly, the silica container produced by the method for producing a silica container in the present invention can be used suitably as a crucible for pulling up of a silicon single crystal. As a result, a total energy consumption and a total cost for production of a silicon single crystal can be reduced. Further, because gaseous molecules dissolved in the produced silica container can be suppressed, release of the gaseous molecules from the silica container can be suppressed so that a harmful effect by the gaseous molecules to a silicon single crystal to be pulled up can be reduced.

Further, the present invention provides a silica container comprised of:

a substrate having a rotational symmetry and comprised of a silica having a white opaque layer part containing gaseous bubbles at least in its peripheral part, an intermediate layer formed on an inner wall of the substrate and comprised of a silica, and an inner layer formed on an inner wall of the intermediate layer and comprised of a colorless and transparent silica glass not substantially containing gaseous bubbles, wherein the substrate contains Li, Na, and K with the total concentration of them being 300 or less ppm by weight, while amount of an $H_2O$ molecule released therefrom upon heating at 1000° C. under vacuum is $3 \times 10^{17}$ or less molecules/$cm^3$, the intermediate layer contains an OH group in the concentration range from 10 to 1000 ppm by weight and at least any one of aluminum and a compound capable of becoming a crystal nucleating agent for crystallization of a silica glass with the total amount of them being in the range from 10 to 1000 ppm by weight, and the inner layer contains an OH group in the concentration range from 1 to 200 ppm by weight with each element concentration of Li, Na, and K being 60 or less ppb by weight, and each element concentration of Ti, V, Cr, Mn, Fe, Co, Ni, Cu, Zn, Zr, Mo, Ta, and W being 30 or less ppb by weight.

According to the silica container like this, it is possible to make the silica container cheap, fully capable of avoiding impurity contamination to a material accommodated therein, and have a high dimensional precision and a high durability, in spite of the low cost silica container. In addition, at the same time because $H_2O$ molecules dissolved in the silica container is suppressed, release of $H_2O$ is also suppressed so that a harmful effect by an $H_2O$ molecule to a material accommodated in the silica container can be reduced.

In this case, the substrate is preferably the one that releases the gases upon heating at 1000° C. under vacuum in the amount of $1 \times 10^{15}$ or less molecules/$cm^2$ for an $O_2$ molecule, $1 \times 10^{17}$ or less molecules/$cm^3$ for an $H_2O$ molecule, $5 \times 10^{16}$ or less molecules/$cm^3$ for an $H_2$ molecule, $5 \times 10^{16}$ or less molecules/$cm^3$ for a CO molecule, and $1 \times 10^{16}$ or less molecules/$cm^3$ for a $CO_2$ molecule.

When amounts of the released gases upon heating of the substrate at 1000° C. under vacuum are as mentioned above, each gas molecule dissolved in the substrate is suppressed so that a harmful effect by each gas molecule to a material accommodated in the silica container can be reduced even further.

In addition, it is preferable that the intermediate layer contain an OH group in the concentration range from 30 to 300 ppm by weight, aluminum in the concentration range from 30 to 300 ppm by weight, and the crystal nucleating agent in the concentration range from 30 to 300 ppm by weight.

Accordingly, when the intermediate layer contains an OH group, aluminum, and the crystal nucleating agent in each of the foregoing concentration ranges simultaneously, impurity contamination to a material accommodated therein can be reduced even further.

In addition, it is preferable that the crystal nucleating agent be any one or more of CaO, MgO, BeO, $ZrO_2$, $HfO_2$, $Al_2O_3$, $ZrB_2$, $HfB_2$, $TiB_2$, $LaB_6$, ZrC, HfC, TiC, TaC, ZrN, HfN, TiN, and TaN.

Accordingly, when the crystal nucleating agent is one or more of the compounds as mentioned above, the prevention effect of impurity diffusion can be given to the intermediate layer more effectively so that impurity contamination to a material accommodated therein can be reduced even further.

In addition, the inner layer is preferably the one that releases the gases upon heating at 1000° C. under vacuum in the amount of $1 \times 10^{15}$ or less molecules/$cm^2$ for an $O_2$ molecule, $3 \times 10^{17}$ or less molecules/$cm^3$ for an $H_2O$ molecule, $5 \times 10^{16}$ or less molecules/$cm^3$ for an $H_2$ molecule, $5 \times 10^{16}$ or less molecules/$cm^3$ for a CO molecule, and $1 \times 10^{16}$ or less molecules/$cm^3$ for a $CO_2$ molecule.

When amounts of the released gases upon heating of the inner layer at 1000° C. under vacuum are as mentioned above, each gas molecule dissolved in the inner layer is suppressed so that a harmful effect by each gas molecule to a material accommodated in the silica container can be reduced even further.

In addition, it is preferable that the inner layer contain at least one element of Ca, Sr, and Ba with the total element concentration of Ca, Sr, and Ba contained therein being in the range from 50 to 5000 ppm by weight.

Further, it is preferable that the inner layer have further a coating layer, on an inner surface side of the inner layer, containing at least one element of Ca, Sr, and Ba with the total element concentration of Ca, Sr, and Ba contained in the coating layer being in the range from 5 to 500 μg/cm².

Accordingly, when the inner layer is made to satisfy at least any one of the following: the inner layer contains at least one element of Ca, Sr, and Ba with the total element concentration being 50 to 5000 ppm by weight, and the coating layer containing at least one element of Ca, Sr, and Ba with the total element concentration being in the range from 5 to 500 μg/cm² is formed on an inner surface side of the inner layer, the inner layer is recrystallized at the time of using the silica container at such high temperature as in the range from 1300 to 1600° C., resulting in not only enabling to further reduce impurity contamination to a material accommodated therein but also enabling to suppress etching and dissolution of surface of the inner layer.

Advantageous Effects of the Invention

As described above, according to the method for producing a silica container in the present invention, gas molecules dissolved in the produced silica container can be suppressed. Therefore, gas molecules released from the silica container upon its use can be suppressed; thus a harmful effect by the gas molecules to a material accommodated in the silica container can be reduced. With this, a silica container, having a high dimensional precision and a high durability, capable of fully avoiding impurity contamination to a material accommodated therein, can be produced with a low energy consumption, a high productivity, and a low cost.

In addition, according to the silica container of the present invention, a cheap silica container, having a high dimensional precision and a high durability, capable of fully avoiding impurity contamination to a material accommodated therein can be produced in spite of the low cost silica container. With this, in addition, because gas molecules including an $H_2O$ molecule dissolved in the silica container is suppressed, release of these gas molecules is also suppressed; and thus a harmful effect by these gas molecules to a material accommodated in the silica container can be reduced.

DESCRIPTION OF EMBODIMENTS

Figure 1:
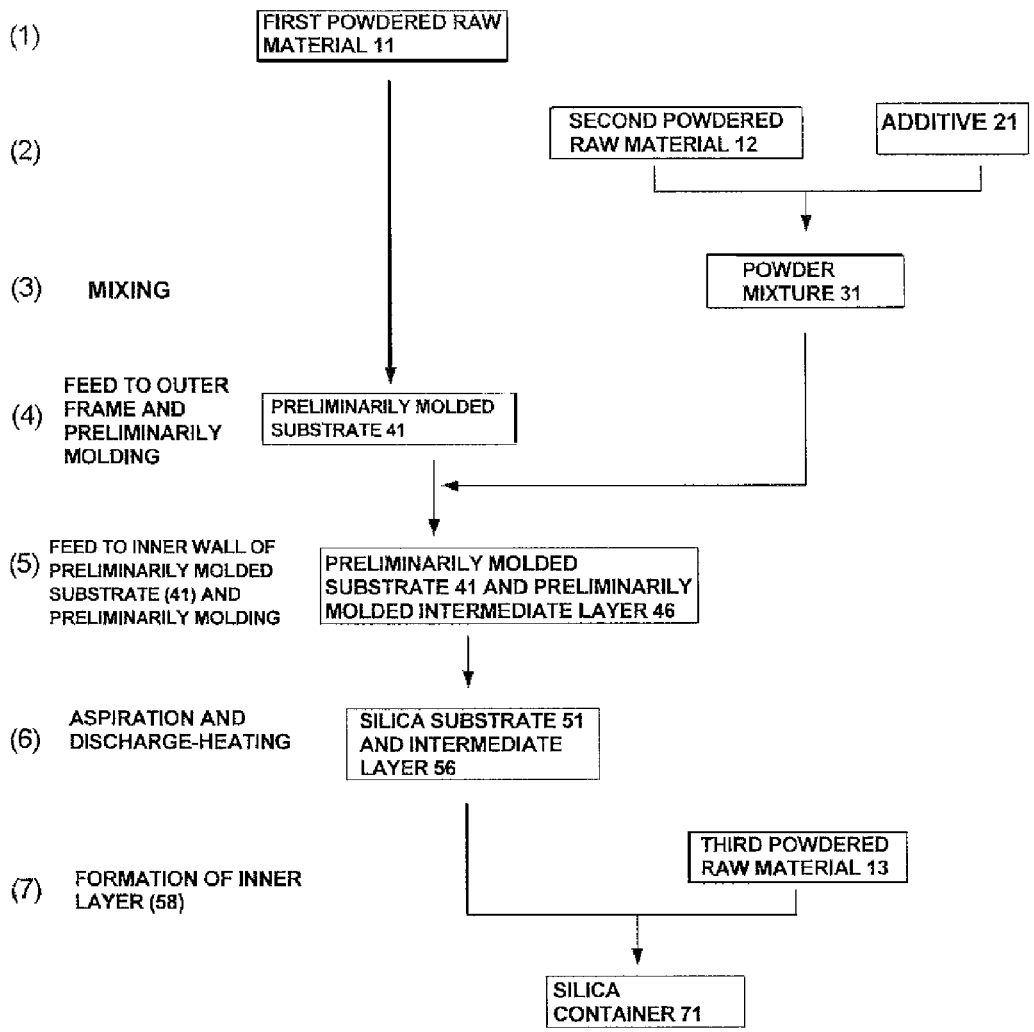
FIG. 1 is a flow chart showing outline of the method for producing a silica container in the present invention.

As mentioned above, in a conventional method for producing the silica container, there have been such problems as a large energy consumption due to high temperature for processing and heat-treatment, and an extraordinary large emission of carbon dioxide. In addition, the method has a problem of a high production cost because ultra-pure powdered quartz is used as a raw material for the entire container.

Further, as mentioned above, in the silica container obtained by a conventional method for producing a silica container, there has been a problem of the gas effect to a material accommodated therein, such as incorporation of gaseous bubbles into a silicon single crystal in a crucible for growing of a silicon single crystal.

The inventors of the present invention carried out investigation in view of the problems like these and found the following problems to be solved.

The first problem is to make the silica container have reduced amounts of dissolved gases (i.e., low gas release), such as an $O_2$ gas (an oxygen molecule), an $H_2$ gas (a hydrogen molecule), an $H_2O$ gas (a water molecule), a CO gas (a carbon monoxide molecule), and a $CO_2$ gas (a carbon dioxide molecule).

This is because, if such gases as an $O_2$ gas, an $H_2$ gas, an $H_2O$ gas, a CO gas, and a $CO_2$ gas are incorporated in the silica container, in the case of the silica container used to pull up a silicon single crystal, these gases are released into a silicon melt at the time of silicon crystal production; these gases are then incorporated into a growing silicon single crystal as gaseous bubbles. When the silicon single crystal thus formed is used as a wafer, these incorporated gases form a void and a pinhole thereby resulting in an exceedingly decreased production yield. Accordingly, reduction of release of gas molecules from the silica container was considered to be the first problem.

Among the foregoing gases, dissolved amount of an $H_2O$ gas was particularly large in the past; and thus reduction of amount of this dissolved $H_2O$ gas was considered to be the central problem to be solved in particular.

A silica container such as a crucible and a boat for melting of a metal silicon and for production of a silicon single crystal requires thermal uniformity inside the container under atmosphere of high temperature heating. Because of this, the second problem is to make at least the silica container a multi-layer structure, wherein an outer part of the container is made to a porous white opaque silica glass while an inner part of the container is made to a colorless transparent silica glass with substantially little gaseous bubbles.

Particularly for a silica container such as a crucible and a boat for production of a silicon single crystal, a large silica container is required as the silicon crystal progresses toward a larger diameter; and thus the third problem is to prevent softening and deformation of the silica container itself at high temperature for melting of a metal silicon (for example about 1400 to about 1600° C.) from occurring.

If a metal element contained as the impurity in the silica container, for example, not only an alkali metal element such as Li (lithium), Na (sodium), and K (potassium), but also, in particular, Ti (titanium), V (vanadium), Cr (chromium), Mn (manganese), Fe (iron), Co (cobalt), Ni (nickel), Cu (copper), Zn (zinc), Zr (zirconium), Mo (molybdenum), Ta (tantalum), and W (tungsten) is incorporated into a silicon crystal at the time of silicon crystal production, it leads, for example, to decrease in the incident photon-to-current conversion efficiency in a silicon device for solar use (for solar photovoltaic power generation). Accordingly, the fourth problem is to provide the silica container with an effect to adsorb and immobilize impurities and an effect to shield impurities (diffusion-prevention) so that impurities contained in the silica container may not diffuse into a silicon melt.

If a component of a silica container itself is dissolved into a silicon melt at the time of silicon crystal production thereby causing incorporation of, in particular, an element of oxygen into the silicon crystal, there appears a problem such as, for example, causing decrease in the incident photon-to-current conversion efficiency in production of a silicon device for solar use. Accordingly, the fifth problem is to make a silica container have characteristics that the inside surface of the silica container does not dissolve easily to a silicon melt (i.e., having etching resistance properties).

As mentioned above, in the present invention, it was necessary to simultaneously solve these five technical problems in a lower cost than a silica container such as a crucible for pulling up of a high purity single crystal silicon by a conventional method. Accordingly, the sixth problem to be solved was to obtain a low cost production method by using a cheap silica raw material not requiring a treatment for ultrahigh purification.

Hereinafter, the present invention will be explained with referring to the figures, but the present invention is not limited to them. In particular in the following, a silica container (a solar-grade crucible) applicable as a container for melting of a metal silicon used as a material for a solar cell (a solar photovoltaic power generation, or a solar power generation) as well as a production method thereof will be explained mainly as one suitable example of application of the present invention; but the present invention is not limited to this and can be applied widely to a general silica container having a rotational symmetry and mainly comprised of a silica.

Figure 2:
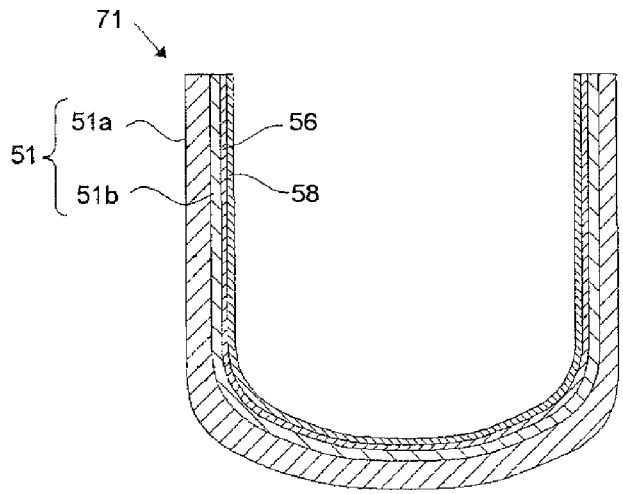
FIG. 2 is a schematic cross section view of one example of the silica container of the present invention.

In FIG. 2, a schematic cross section view of one example of the silica container of the present invention is shown.

The silica container 71 of the present invention has a rotational symmetry, and its basic structure is formed of three layers comprised of the substrate 51, the intermediate layer 56, and the inner layer 58, successively from outside. These respective layers have their own responsible roles mainly; for durability such as heat deformation resistance in the substrate 51, for prevention of impurity diffusion in the intermediate layer 56, and for etching resistance to a material accommodated therein in the inner layer 58.

As far as the container has at least these layers, the silica container of the present invention may contain a layer other than these layers.

Hereinafter, each of the substrate 51, the intermediate layer 56, and the inner layer 58 will be specifically explained.

Firstly, the substrate 51 will be explained.

The substrate 51 has at least a part comprised of a gaseous bubble-containing white opaque layer 51a (hereinafter also referred to as an opaque layer part) in its outer peripheral part. Alternatively, a part comprised of a transparent or a semi-transparent layer 51b (hereinafter also referred to as a transparent layer part) may be arranged inside the white opaque layer part 51a. With this, thermal uniformity inside the silica container 71 can be increased under heating condition.

Purity of silica of the substrate 51 in the present invention can be made relatively low, in the range from 99.9 to 99.999% by weight. According to the silica container of the present invention, even if a silica container is made cheap with the substrate 51 having such a low purity, impurity contamination to a material accommodated therein can be fully avoided.

The substrate 51 with the total element concentration of an alkali metal of Li, Na, and K being 300 ppm or less by weight is used.

When the silica container 71 having the structure of the present invention is used, impurity contamination to a material accommodated therein can be fully avoided even if the substrate 51 with relatively high total element concentration, such as 300 ppm or less by weight, of an alkali metal of Li, Na, and K contained therein is used.

When the total element concentration of an alkali metal of Li, Na, and K is 300 ppm or less by weight, a heat distortion at high temperature can be suppressed. In this case, the substrate 51 may contain, in addition, an aluminum element in the range from 30 to 3000 ppm by weight simultaneously. With this, fine particles of a silica such as cristobalite and an aluminosilicate are formed in large quantity in the substrate 51 under the temperature condition at about 1500° C. at the time of silicon crystal production thereby enabling to improve the heat distortion resistance of the substrate 51 greatly.

On top of that, effect of containing aluminum in the substrate 51 resides in that the silica glass viscosity at high temperature can be improved; and thus a resistance to thermal distortion of the silica container 71 at high temperature can be improved further.

The silica container 71 is used at high temperature and under reduced pressure in many cases; and thus it is necessary to reduce amount of gas release from the silica container 71 under such conditions. The substrate 51 needs to be the one that releases $3 \times 10^{17}$ or less molecules/$cm^3$ of an $H_2O$ molecule when heated at 1000° C. under vacuum.

In addition, it is more preferable that amount of released gases when heated at 1000° C. under vacuum be $1 \times 10^{15}$ or less molecules/$cm^2$ for an $O_2$ molecule, $1 \times 10^{17}$ or less molecules/$cm^3$ for an $H_2O$ molecule, $5 \times 10^{16}$ or less molecules/$cm^3$ for an $H_2$ molecule, $5 \times 10^{16}$ or less molecules/$cm^3$ for a CO molecule, and $1 \times 10^{16}$ or less molecules/$cm^3$ for a $CO_2$ molecule.

If each gas molecule dissolved in the substrate 51 is suppressed as mentioned above, a harmful effect by each gas molecule to a material accommodated in the silica container can be reduced. For example, when the silica container 71 of the present invention is used for pulling up of a silicon single crystal, a structural defect such as gaseous bubbles, called a void or a pinhole, is brought about in the crystal if the foregoing gases are released whereby these gases are incorporated into the silicon crystal; however, according to the present invention, this harmful effect can be reduced.

Then, the intermediate layer 56 will be explained.

The intermediate layer 56 is formed on an inner wall of the substrate 51 and is comprised of a silica.

If the intermediate layer 56 contains at least one kind of crystal nucleating agents (agents to form crystal nucleus) of powdered heat-resistant ceramics (powdered compound melting at high temperature of about 2000° C. or higher), for example, oxides such as CaO, MgO, BeO, $ZrO_2$, $HfO_2$, and $Al_2O_3$, borates such as $ZrB_2$, $HfB_2$, $TiB_2$, and $LaB_6$, carbides such as ZrC, HfC, TiC, and TaC, and nitrides such as ZrN, HfN, TiN, and TaN, fine crystals of a cristobalite, an opal, and the like are formed around the crystal nucleating agent as the crystal center thereby expressing the prevention effect of metal impurity diffusion, when the container is heat-treated in the temperature range from about 1400° C. to about 1600° C. before its use as the container thereafter or the container is used in the temperature range from about 1400° C. to about 1600° C.

It is preferable that the intermediate layer 56 contain an OH group in the concentration range from 30 to 300 ppm by weight, aluminum in the concentration range from 30 to 300 ppm by weight, and the crystal nucleating agent in the range from 30 to 300 ppm by weight. It is further preferable that these conditions be satisfied simultaneously.

Details of a mechanism for aluminum, the crystal nucleating agent, and an OH group to prevent migration and diffusion of metal element impurities in the silica glass from occurring are not known; but it is assumed that a positive ion (cation) of metal element impurities balances in its electric charge with a silica glass network by displacing Si with Al, resulting in adsorption as well as prevention of diffusion from occurring. The crystal nucleating agent is a compound that becomes a crystal nucleus of a cristobalite, an opal, and other silica minerals when the silica container is used at high temperature in the range from 1400 to 1600° C.; it is assumed that these fine crystals formed in the silica glass (that is, glass ceramics is formed) drastically decreases the diffusion coefficients of metal element impurities. Further, it is assumed that effect of adsorption or diffusion prevention of metal element impurities is expressed by displacing a hydrogen ion of the OH group with a metal ion.

The intermediate layer 56 is a white and opaque or a colorless and transparent silica glass; and its role is to shield diffusion or migration of impure metal elements contained in the substrate to the inner layer.

The intermediate layer 56 contains an OH group in the concentration range from 10 to 1000 ppm by weight. In addition, the intermediate layer 56 contains at least one of aluminum and a compound capable of becoming a crystal nucleating agent with the total amount of them being in the range from 10 to 1000 ppm by weight. With this, adsorption and immobilization of impure metal elements can be done.

Thickness of the intermediate layer 56 is not particularly limited; but it is preferably in the range from 0.1 to 5 mm. If the thickness of the intermediate layer 56 is 0.1 mm or more, impurity diffusion to inside of the silica container can be fully suppressed; and thus impurity contamination to a material accommodated therein can be fully avoided. If the thickness of the intermediate layer is 5 mm or less, the silica container can be produced with a satisfactorily low cost without excessive energy consumption necessary for its production.

Control of the OH concentration can be done by such methods as adjusting an OH group contained in a powdered raw material (i.e., a second powdered raw material 12) for forming the intermediate layer 56 (this method will be mentioned later), and changing the conditions of atmosphere, temperature, and time in a step of melting and sintering in production of the silica container (this method will be mentioned later). By making the OH concentration in the range as described above, effect of adsorption and immobilization of metal element impurities can be improved.

When the upper limit of the OH concentration in the intermediate layer 56 is made 1000 ppm by weight, decrease of the silica glass viscosity at high temperature caused by increase in the OH concentration can be suppressed.

Then, the inner layer 58 will be explained.

The inner layer 58 is formed on an inner wall of the intermediate layer 56 and is comprised of a colorless and transparent silica glass with not containing gaseous bubbles substantially. The inner layer 58 contains an OH group in the concentration range from 1 to 200 ppm by weight, while each element concentration of Li, Na, and K is made to 60 or less ppb by weight and each element concentration of Ti, V, Cr, Mn, Fe, Co, Ni, Cu, Zn, Zr, Mo, Ta, and W is made to 30 or less ppb by weight.

It is preferable that the inner layer 58 contain an OH group in the concentration range from 30 to 100 ppm by weight while each element concentration of Li, Na, and K be made to 20 or less ppb by weight and each element concentration of Ti, V, Cr, Mn, Fe, Co, Ni, Cu, Zn, Zr, Mo, Ta, and W be made to 10 or less ppb by weight.

Accordingly, when the inner layer 58 contains an OH group in the concentration range from 30 to 100 ppm by weight, diffusion of impure metal elements can be suppressed more effectively so that a harmful effect by impure metal elements to a material accommodated in the silica container can be reduced more effectively. Further, when concentration of each element in the inner layer 58, i.e., Li, Na, K, Ti, V, Cr, Mn, Fe, Co, Ni, Cu, Zn, Zr, Mo, Ta, and W, is the value as described above, a harmful effect by impure metal elements to a material accommodated in the silica container can be reduced even further.

In addition, the inner layer 58 is preferably the one that releases the gases upon heating at 1000° C. under vacuum in the amount of $1 \times 10^{15}$ or less molecules/cm$^2$ for an $O_2$ molecule, $3 \times 10^{17}$ or less molecules/cm$^3$ for an $H_2O$ molecule, $5 \times 10^{16}$ or less molecules/cm$^3$ for an $H_2$ molecule, $5 \times 10^{16}$ or less molecules/cm$^3$ for a CO molecule, and $1 \times 10^{16}$ or less molecules/cm$^3$ for a $CO_2$ molecule.

When each gas molecule dissolved in the inner layer 58 is suppressed as mentioned above, a harmful effect by each gas molecule to a material accommodated in the silica container can be reduced even further.

When an $H_2O$ gas (an $H_2O$ molecule) and an $O_2$ gas (an $O_2$ molecule) contained in the inner layer 58 is reduced, especially in the case that the silica container 71 is used as a crucible for pulling up of a silicon single crystal, release of water and oxygen upon melting of silicon can be reduced thereby enabling to reduce oxygen concentration and to reduce forming of crystal defects such as a void and a pinhole in the silicon crystal.

Specifically, it is preferable that concentration of an $H_2O$ molecule and an $O_2$ molecule contained in the inner layer 58 be $3 \times 10^{17}$ or less molecules/cm$^3$ for an $H_2O$ gas and $1 \times 10^{15}$ or less molecules/cm$^2$ for an $O_2$ gas (the amounts of released gases are measured by heating of a measuring sample, obtained from the inner layer 58 by cutting, at 1000° C. under vacuum).

When the silica container 71 of the present invention is used as a crucible for pulling up of a silicon single crystal thereby requiring high durability, such as, for example, a container for continuous pulling up (multipulling) of a silicon single crystal in manufacturing of a solar power generation device, it is preferable that at least one element of calcium (Ca), strontium (Sr), and barium (Ba), the element belonging to the group 2 (group IIA), be contained in the inner layer 58 in order to reduce etching dissolution of the inner layer 58 by the silicon melt of a material accommodated therein. In this case, it is preferable that the total element concentration of Ca, Sr, and Ba contained in the inner layer 58 be in the range from 50 to 5000 ppm by weight. It is more preferable that the element belonging to the group 2 be Sr or Ba, while Ba is still more preferable because it is difficult to be incorporated into a silicon single crystal.

If at least one element of Ca, Sr, and Ba is contained in the inner layer 58 as mentioned above, inner surface of the inner layer 58, i.e., inner surface of the silica container, is recrystallized at the temperature of melting of silicon (about 1500° C.) thereby forming a cristobalite; and thus high etching resistance to the silicon melt can be obtained.

Alternatively, if a coating layer containing at least one element of Ca, Sr, and Ba is formed inside the inner layer 58, a similar effect can be obtained. In this case, it is preferable that the total element concentration of Ca, Sr, and Ba contained in the coating layer be in the range from 5 to 500 µg/cm$^2$.

The crystallization facilitating agents as mentioned above are described in the literatures (Japanese Patent No. 3100836 and Japanese Patent No. 3046545).

Hereinafter, a method for producing a silica container of the present invention, enabling to produce the silica container as mentioned above, will be explained more specifically. In particular, a method for producing a silica container (solar-grade crucible) with a low production cost, usable as a container for melting of a metal silicon (Si) used as a material of a solar power generation device and the like as well as for pulling up of a single crystal, will be explained as the example.

Schematic diagram of a method for producing the silica container 71 of the present invention is shown in FIG. 1.

Firstly, a first powdered raw material 11 (silica particles) is prepared as shown in FIG. 1, (1) (Step 1).

The first powdered raw material 11 will become a main composition material of the substrate 51 in the silica container of the present invention (refer to FIG. 2).

The first powdered raw material can be obtained by crushing mass of silica and classifying the powders thereby obtained, for example, by the method as described below, though not limited to it.

Firstly, mass of natural silica (a naturally produced berg crystal, a quartz, a silica, a silica stone, an opal stone, and so forth) with diameter in the range from about 5 to about 50 mm is heated in the temperature ranging from 600 to 1000° C. for about 1 to about 10 hours under an air atmosphere. Then, the mass of natural silica thus treated is poured into water to be cooled down quickly, separated, and then dried. With these treatments, subsequent crushing by a crusher or the like and classification treatment of the obtained powders can be executed easily; but crushing treatment may be executed without executing the foregoing heating and quick cooling treatments.

Then, the mass of the natural silica is crushed by a crusher or the like, and then classified to particles having diameter of preferably in the range from 10 to 1000 µm, and more preferably in the range from 50 to 500 µm, to obtain a powdered natural silica.

Thereafter, the powdered natural silica thus obtained is heated at 700 to 1100° C. for about 1 hour to about 100 hours in a rotary kiln made of a silica glass tube having an inclination angle, inside of which is made to an atmosphere containing a hydrogen chloride gas (HCl) or a chlorine gas (Cl$_2$) for high-purification treatment. However, for the use not requiring a high purity, this high-purification treatment can be omitted to proceed to the subsequent steps.

The first powdered raw material 11 obtained after the foregoing steps is a crystalline silica; but depending on the use purpose of the silica container, an amorphous silica glass scrap may also be used as the first powdered raw material 11.

Diameter of the first powdered raw material 11 is preferably in the range from 10 to 1000 µm, and more preferably in the range from 50 to 500 µm, as mentioned above.

Silica purity of the first powdered raw material 11 is preferably 99.9% or more by weight, and more preferably 99.99% or more by weight. According to the method for producing a silica container in the present invention, even if silica purity of the first powdered raw material 11 is made relatively low, i.e., 99.999% or less by weight, impurity contamination to a material accommodated in the produced silica container can be fully avoided. Accordingly, the silica container can be produced with a lower cost as compared with the conventional methods.

It is preferable that concentration of an OH group contained in the first powdered raw material 11 be in the range from about 10 to about 1000 ppm by weight.

The amount of an OH group contained in the first powdered raw material 11 may be as it is contained in the natural silica stone; or alternatively the amount of water to be added in the intermediate step can be controlled by gas atmosphere, treatment temperature, and time, in a step of drying followed thereafter. A silica glass synthesized by the flame hydrolysis method or the flame Vernueuil method contains an OH group in the range from 200 to 2000 ppm by weight; and thus concentration of an OH group can also be controlled by adding an appropriate amount of the OH-containing amorphous powdered silica obtained by these methods.

Similar to the second powdered raw material 12 as will be described later, any one of an aluminum compound and a powdered compound capable of becoming a crystal nucleating agent may also be added to the first powdered raw material 11.

Then, as shown in FIG. 1, (2), the second powdered raw material 12 (silica particles) and, as the additive 21, at least any one of an aluminum compound and a powdered compound capable of becoming a crystal nucleating agent for crystallization of a silica glass, for forming the intermediate layer 56 are arranged (Step 2).

Then, as shown in FIG. 1, (3), an additive 21 (namely, at least any one of an aluminum compound and a powdered compound capable of becoming a crystal nucleating agent for crystallization of a silica glass) is added to the second powdered raw material 12 to obtain a powder mixture 31 (Step 3).

It is preferable that purity of the second powdered raw material 12 (silica particles) for forming the intermediate layer 56 be higher than that of the first powdered raw material 11; but the purity is not limited to it. For example, preparation of the second powdered raw material 12 can be done roughly in the same manner as the case for the first powdered raw material. That is, preparation of the second powdered raw material 12 can be done as following.

Firstly, mass of natural silica (a naturally produced berg crystal, a quartz, a silica, a silica stone, an opal stone, and so forth) with diameter in the range from about 5 to about 50 mm is heated in the temperature ranging from 600 to 1000° C. for about 1 to about 10 hours under an air atmosphere. Then, the mass of natural silica thus treated is poured into water to be cooled down quickly, separated, and then dried. With these treatments, subsequent crushing by a crusher or the like and classification treatment of the obtained powders can be executed easily; but crushing treatment may be executed without executing the foregoing heating and quick cooling treatments.

Then, mass of the natural silica is crushed by a crusher or the like, and then classified to particles having diameter of preferably in the range from 10 to 1000 µm, and more preferably in the range from 50 to 500 µm, to obtain a powdered natural silica.

Thereafter, the powdered natural silica thus obtained is heated at 700 to 1100° C. for about 1 hour to about 100 hours in a rotary kiln made of a silica glass tube having an inclination angle, inside of which is made to an atmosphere containing a hydrogen chloride gas (HCl) or a chlorine gas (Cl$_2$) for high-purification treatment.

The second powdered raw material 12 obtained after the foregoing steps is a crystalline silica; but depending on the use purpose of the silica container, an amorphous silica glass scrap may also be used as the second powdered raw material 12.

Diameter of the second powdered raw material 12 is preferably in the range from 10 to 1000 μm, and more preferably in the range from 50 to 500 μm, as mentioned above.

It is preferable that silica purity of the second powdered raw material 12 be made to preferably 99.999% or more by weight.

As mentioned above, because the first powdered raw material 11 for formation of the substrate 51 is of relatively low purity, the second powdered raw material 12 for formation of the intermediate layer 56 is made to contain prescribed amount of an aluminum compound or a crystal nucleating agent to prevent migration and diffusion of an impure metal element into the inner layer 58 from the substrate 51 of the silica container 71. Aluminum is added, for example, as an aqueous or alcoholic solution of an aluminum salt of nitrate, acetate, carbonate, chloride, or the like; a powdered silica is added into such a solution, soaked with it, and then dried to obtain the powder mixture. As the crystal nucleating agent, a finely powdered compound having a melting point of 2000° C. or higher can be used; candidate examples of the agent include an oxide such as CaO, MgO, BeO, $ZrO_2$, $HfO_2$, and $Al_2O_3$, a borate such as $ZrB_2$, $HfB_2$, $TiB_2$, and $LaB_6$, a carbide such as ZrC, HfC, TiC, and TaC, and a nitride such as ZrN, HfN, TiN, and TaN. Among these compounds having high melting points, a prescribed amount of a finely powdered compound suitably usable for the silica container, having particle diameter in the range from about 0.1 to about 10 μm, is selected and mixed into the powdered silica.

It is preferable that concentration of an OH group contained in the second powdered raw material 12 be in the range from about 10 to about 1000 ppm by weight.

The amount of an OH group contained in the second powdered raw material 12 may be as it is contained in the natural silica stone; or alternatively the amount of water to be added in the intermediate step can be controlled by gas atmosphere, treatment temperature, and time, in a step of drying followed thereafter. A silica glass synthesized by the flame hydrolysis method or the flame Vernueuil method contains an OH group in the range from 200 to 2000 ppm by weight; and thus concentration of an OH group can also be controlled by adding an appropriate amount of the OH-containing amorphous powdered silica obtained by these methods.

Then, the first powdered raw material 11 is fed into an outer frame having a rotational symmetry for molding, as shown in FIG. 1, (4) (Step 4).

Figure 3:
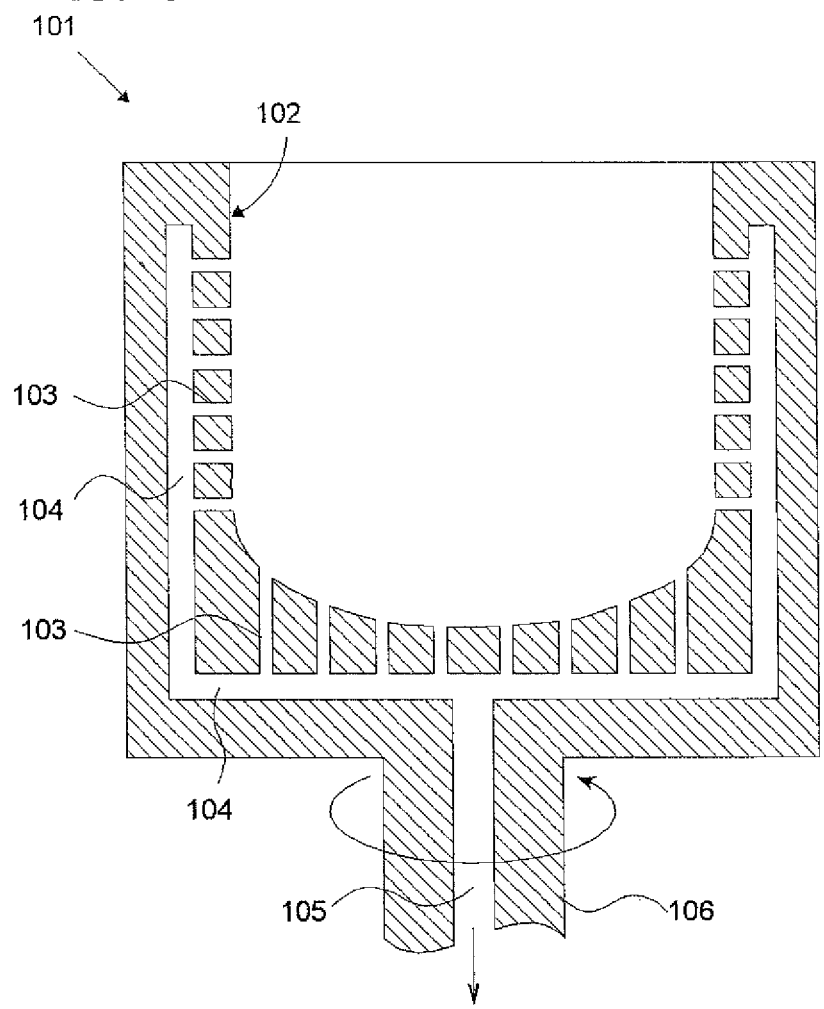
FIG. 3 is a schematic cross section view of one example of the outer frame usable in the method for producing a silica container in the present invention.

In FIG. 3, a schematic cross section view of an outer frame for preliminary molding of the first powdered raw material 11 is shown. The outer frame 101 is made of heat-resistant ceramics such as graphite, alumina, silicon nitride, and silicon carbide, and has a rotational symmetry. In the inner wall 102 of the outer frame 101, the aspiration holes 103 are arranged splittingly. The aspiration holes 103 are connected to the aspiration path 104. The rotation axis 106 to rotate the outer frame 101 is also arranged with the aspiration path 105, through which aspiration can be done.

Figure 4:
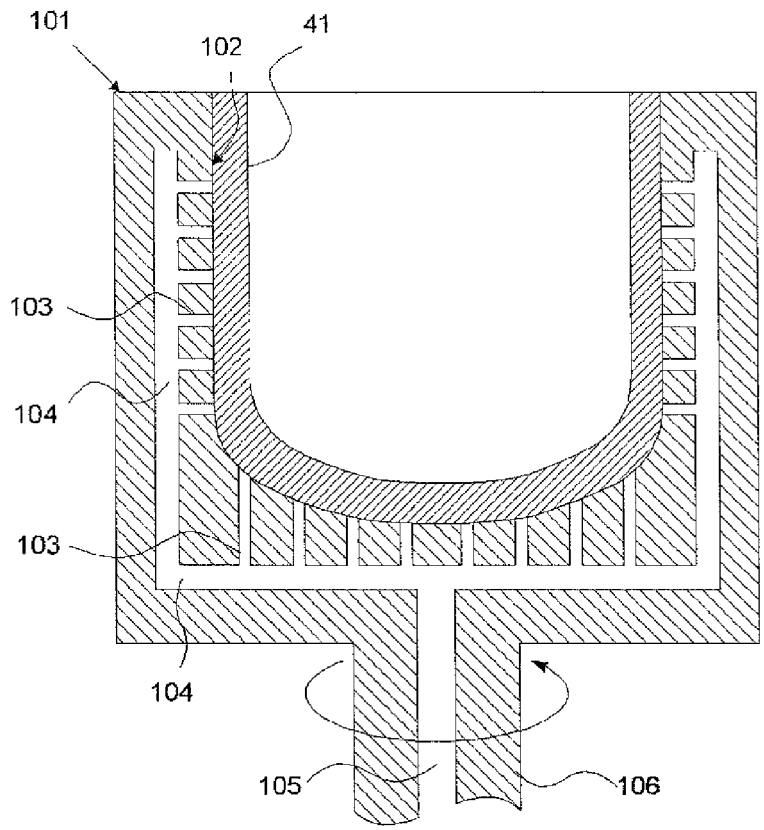
FIG. 4 is a schematic cross section view schematically showing one example of the process step of forming the preliminarily molded substrate in the method for producing a silica container in the present invention.

The first powdered raw material 11 is fed into the inner wall 102 of the outer frame 101 to preliminarily mold the first powdered raw material 11 to a prescribed shape in accordance with the inner wall 102 of the outer frame 101 thereby giving the preliminarily molded substrate 41 (refer to FIG. 4).

Specifically, the first powdered raw material 11 is fed gradually into the inner wall 102 of the outer frame 101 from a powdered raw material hopper (not shown) while rotating the outer frame 101 thereby molding to a shape of container by utilizing the centrifugal force. Alternatively, thickness of the preliminarily molded substrate 41 may be controlled to the prescribed value by contacting a plate-like inner frame (not shown) to the rotating powders from inside.

A feeding method of the first powdered raw material 11 into the outer frame 101 is not particularly limited; for example, a hopper equipped with an agitation screw and a measuring feeder may be used. In this case, the first powdered raw material 11 filled in the hopper is fed with agitating by the agitation screw while controlling the feeding amount by the measuring feeder.

Then, as shown in FIG. 1, (5), the second powdered raw material 12 added with the additive 21 (namely, the powder mixture 31) is fed to an inner wall of the preliminarily molded substrate 41 thereby forming the preliminarily molded intermediate layer 46 by preliminarily molding to the prescribed shape in accordance with the inner wall of the preliminarily molded substrate 41 (refer to FIG. 5) (Step 5).

Specifically, this preliminarily molded intermediate layer 46 can be formed roughly in the same manner as in the case of the formation of the preliminarily molded substrate 41, as described above. Namely, the powder mixture 31 is fed gradually into the inner wall of the preliminarily molded substrate 41 from a powdered raw material hopper (not shown) while rotating the outer frame 101 having the formed preliminarily molded substrate 41 on its wall thereby molding to a prescribed shape in accordance with the inner wall of the preliminarily molded substrate 41 by utilizing the centrifugal force. Alternatively, thickness of the preliminarily molded intermediate layer 46 may be controlled to the prescribed value by contacting a plate-like inner frame (not shown) to the rotating powders from inside.

A feeding method of the powder mixture 31 is similar to that of the first powdered raw material 11; for example, a hopper equipped with an agitation screw and a measuring feeder may be used.

Then, as shown in FIG. 1, (6), the substrate 51 and the intermediate layer 56 are formed by the discharge-heating under aspiration (Step 6).

Figure 6:
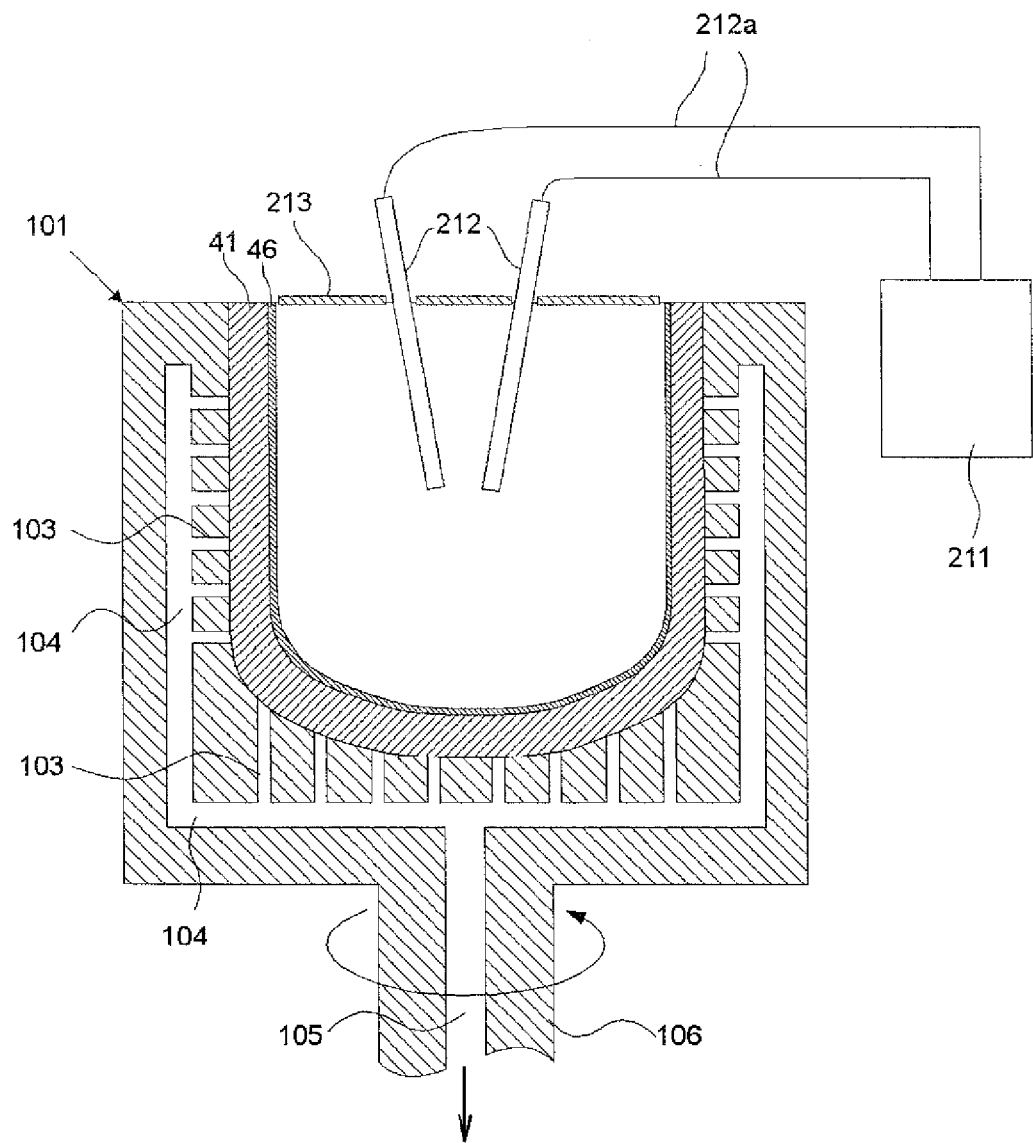
FIG. 6 is a schematic cross section view schematically showing a part of one example of the process step (before discharge-heat melting) of forming the substrate and the intermediate layer in the method for producing a silica container in the present invention.
Figure 7:
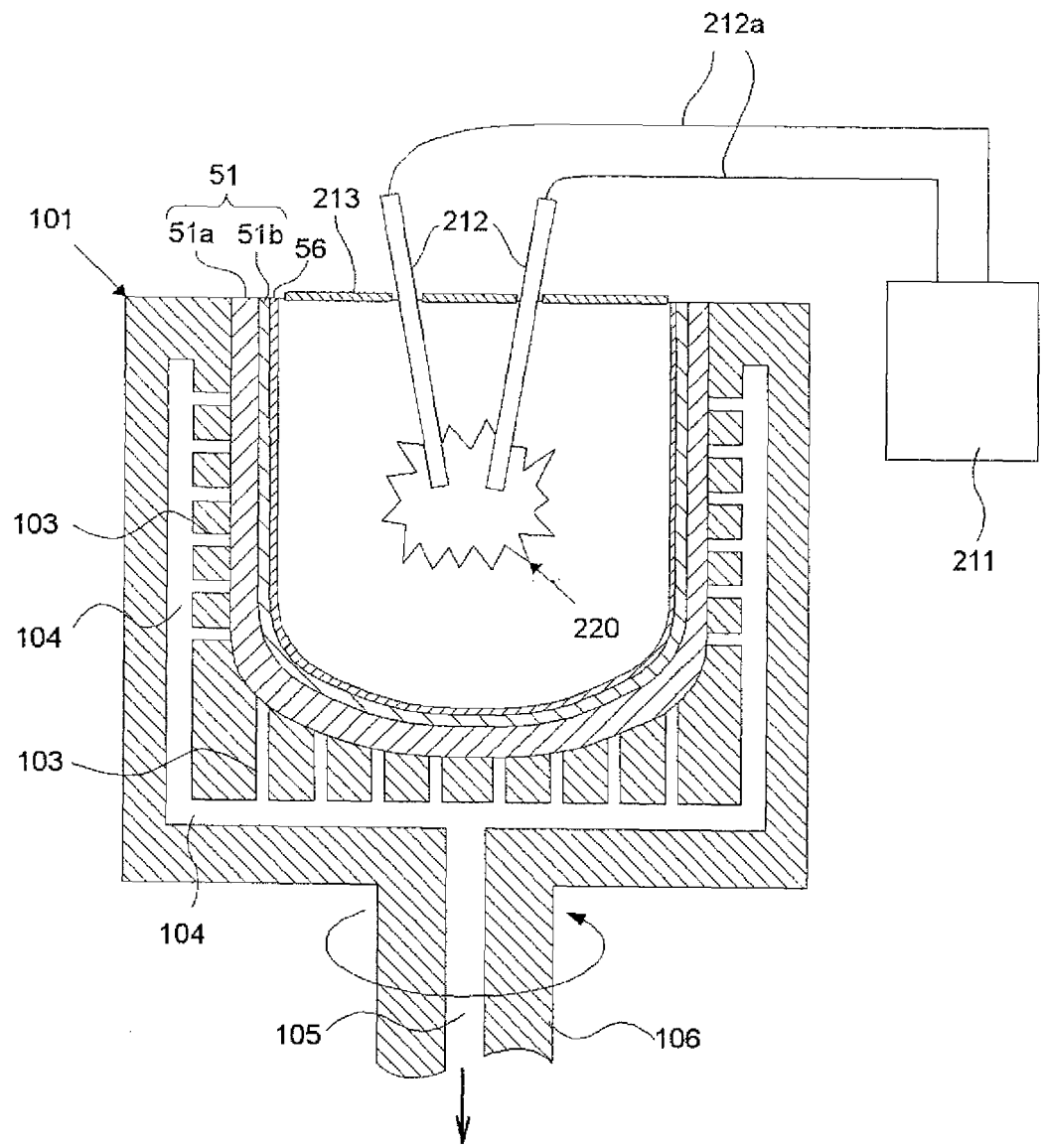
FIG. 7 is a schematic cross section view schematically showing a part of one example of the process step (during discharge-heat melting) of forming the substrate and the intermediate layer in the method for producing a silica container in the present invention.

Specifically, as shown in FIG. 6 and FIG. 7, the preliminarily molded substrate 41 and intermediate layer (the preliminarily molded substrate 41 and the preliminarily molded intermediate layer 56) are degassed by aspiration from the peripheral side of the preliminarily molded substrate 41 through the aspiration holes 103 formed in the outer frame 101, while simultaneously heating from inside of the preliminarily molded substrate and intermediate layer by the discharge-heat melting method, thereby forming the substrate 51 and the intermediate layer 56 having made the peripheral part of the preliminarily molded substrate 41 to a sintered body while the inner part of the preliminarily molded substrate 41 and the preliminarily molded intermediate layer 46 to the fused glass body.

Equipment for forming the substrate 51 and the intermediate layer 56 is comprised of, in addition to the rotatable outer frame 101 having a revolution axis symmetry, a rotation motor (not shown), the carbon electrodes 212 which are the heat source of the discharge melting (arc melting), the electric wirings 212a, the high voltage electricity source unit 211, and the cap 213.

Meanwhile, the equipment can be used later for formation of the inner layer 58 on the inner surface of the intermediate layer 56, as will be described later.

Procedures for melting and sintering of the preliminarily molded substrate 41 and the preliminarily molded intermediate layer 46 are as following: firstly, a vacuum pump (not shown) for degassing is started to aspirate the preliminarily molded substrate 41 from its outside through the aspiration holes 103 and the aspiration paths 104 and 105 and at the same time the electric charge to the carbon electrodes 212 is started, while the outer frame 101 containing the preliminarily molded substrate 41 and the preliminarily molded intermediate layer 46 is rotated at a constant rotation speed.

When the arc discharge is started (shown by numeral code 220) between the carbon electrodes 212, temperature of the inner surface part of the preliminarily molded substrate 41 and the preliminarily molded intermediate layer 46 (namely, the inner surface part of the preliminarily molded intermediate layer 46) reaches melting region of the powdered silica (estimated temperature in the range from about 1800 to about 2000° C.) thereby starting to melt from the most surface layer part. When the most surface layer part is melted, degree of vacuum by the vacuum pump for degassing increases (pressure is lowered rapidly), the change to the fused silica glass layer progresses from inside to outside while dissolved gases contained in the first powdered raw material 11 and the powder mixture 31 (the second powdered raw material 12 containing the added additive 21) are being degassed.

Heating by the electric charge and aspiration by the vacuum pump are continued until the entire region of the intermediate layer is melted to become a transparent to semi-transparent layer and at the same time about half of inside the entire substrate thickness is melted thereby forming the transparent to semitransparent layer part 51b (transparent layer part), while about half of outside remained becomes the sintered white opaque silica part 51a (opaque layer part). Degree of vacuum is preferably $10^3$ Pa or less.

The atmospheric gas inside the substrate 51 having the formed intermediate layer 56 at the time of the arc melting is preferably an inert gas such as nitrogen ($N_2$), argon (Ar), and helium (He) as its main component in order to make consumption of the carbon electrodes 212 small. At this time, the atmospheric gas contains a hydrogen gas ($H_2$) preferably 1% or more by volume, or more preferably in the range of 1 to 50% by volume so that dissolved gases in the silica glass after melting may be made small. As the reason for this, it is assumed that, for example, an oxygen gas ($O_2$), which is difficult to be degassed, reacts with hydrogen to form water ($H_2O$), which is easily released outside the substrate 51 and the intermediate layer 56 because a water molecule has larger diffusion coefficient as compared with an oxygen molecule. In addition, a hydrogen gas ($H_2$) has a larger diffusion coefficient because of a small molecular diameter; and thus it can be easily released outside the substrate 51 and the intermediate layer 56 even if it is contained in the atmospheric gas. Further, $H_2$ contained in the atmosphere has an effect to reduce an $H_2O$ gas, which is easily contained in an excessively large amount among the dissolved gases, from inside of the substrate 51 and the intermediate layer 56.

Then, as shown in FIG. 1, (7), the substrate 51 having the formed intermediate layer 56 is heated from its inside by the discharge-heat melting method while the third powdered raw material 13 comprised of a crystalline silica and having a higher silica purity than the first powdered raw material 11 is spread from inside the substrate 51, thereby forming the inner layer 58 on inner surface of the intermediate layer 56 (Step 7).

A basic forming method of forming the inner layer 58 is according to, for example, the contents described in Patent Document 6 and Patent Document 7.

Explanation will be given with referring to FIG. 8.

The equipment to form the inner layer 58 on the inner surface of the intermediate layer 56 is comprised of, in similar to the foregoing step, the rotatable outer frame 101 having a revolution axis symmetry and arranged with the substrate 51 having the formed intermediate layer 56, a rotation motor (not shown), the hopper 303 for the third powdered raw material 13 for forming the inner layer 58, the agitation screw 304, the measuring feeder 305, the carbon electrodes 212 which are the heat source of the discharge melting (arc melting), the electric wirings 212a, the high voltage electricity source unit 211, and the cap 213.

The inner layer 58 is formed as follows: firstly, the outer frame 101 is set at the prescribed rotation speed, and then high voltage is loaded gradually from the high voltage electricity source unit 211 and at the same time the third powdered raw material 13 (high purity powdered silica) for formation of the inner layer 58 is spread gradually from top of the substrate 51 having the formed intermediate layer 56 through the raw material hopper 303. At this time, the electric discharge has been started between the carbon electrodes 212 so that inside the substrate 51 having the formed intermediate layer 56 is in the temperature range of melting of the powdered silica (estimated temperature ranging from about 1800 to about 2000° C.); and with this, the spread third powdered raw material 13 becomes to melted silica particles thereby attaching to the inner surface of the intermediate layer 56. A mechanism is employed such that the carbon electrodes 212 arranged in the upper opening site of the substrate 51 having the formed intermediate layer 56, a feeding port of the powdered raw material, and the cap 213 may change their positions relative to the substrate 51 having the formed intermediate layer 56 to a certain degree; and by changing these positions, the inner layer 58 can be formed on the entire inner surface of the intermediate layer 56 with a uniform thickness.

The atmospheric gas inside the substrate 51 having the formed intermediate layer 56 at the time of the arc-discharge melting to form the transparent silica glass layer is an inert gas such as a nitrogen gas ($N_2$), an argon gas (Ar), and a helium gas (He) as its main component in order to make consumption of the carbon electrodes small, while the inner layer 58 with less amount of gaseous bubbles can be obtained by making the gas atmosphere mixed with a hydrogen gas ($H_2$) in the range from 1 to 30% by volume. When the amount of $H_2$ in the gas mixture is 1% or more by volume, reducing effect of the gaseous bubbles contained in the inner layer 58 (transparent silica glass) can be made more prominent; on the other hand, when the amount of $H_2$ in the gas mixture is 30% or less by volume, a sufficient reducing effect of the gaseous bubbles contained in the inner layer 58 can be obtained and the cost of the gas mixture can be suppressed; and thus such method is desirable also from an industrial view point. In this case, amount of dissolved $H_2O$ molecules can be effectively reduced by making the atmospheric gas dry without containing moisture.

Further, when the atmosphere is made to a gas mixture with an oxygen gas ($O_2$) in the range from 1 to 30% by volume, fine particles of carbon (C, carbon) generated upon the arc-discharge melting is oxidized to CO and $CO_2$, thereby enabling to obtain the inner layer 58 containing less amount of fine particles of carbon (C). When the amount of $O_2$ in the gas mixture is 1% or more by volume, reducing effect of carbon fine particles contained in the inner layer 58 (transparent silica glass) can be made larger; when the amount of $O_2$ in the gas mixture is 30% or less by volume, sufficient reducing effect of carbon fine particles contained in the inner layer 58 can be obtained and consumption of the carbon electrodes can be lowered at the same time; and thus such method is desirable also from an industrial view point. In this case, CO and $CO_2$ are generated as mentioned above, but they can be removed because of aspiration.

If carbon fine particles generated by the arc-discharge melting, and carbon monoxide (CO) and carbon dioxide ($CO_2$), which are the compounds between carbon and oxygen, are remained in the inner layer 58, they are regenerated as the impurities at the time of pulling up of a silicon single crystal, thereby becoming one cause of decreasing quality of the silicon. In order to suppress this further, it is preferable that inside the silica container is appropriately ventilated during melting with introducing an atmospheric gas at a certain constant rate and exhausting it at a certain constant rate.

As mentioned above, the third powdered raw material 13 can be a powdered silica after high-purification treatment or a powdered silica containing other specific element with the prescribed concentration, depending on use of the silica container finally produced. For example, if an alkaline earth metal element, i.e., calcium (Ca), strontium (Sr), or barium (Ba), is contained in the powdered raw material as the anti-etching agent, the inner layer 58 containing such element is resulted. When the silica container is used in the temperature range from 1300 to 1600° C., the inner layer 58 is recrystallized to form a cristobalite layer thereby preventing diffusion contamination of impure metal elements contained in the substrate 51 to a material to be treated in the container and enabling to reduce etching and dissolution of a silica glass on surface of the inner layer 58.

In the way as mentioned above, the silica container 71 of the present invention can be obtained, while the silica container is cleaned as following when it is necessary.

[Cleaning and Drying of the Silica Container]

For example, the silica container is etched on its surface by an aqueous solution of hydrogen fluoride (HF) in the concentration range from about 1 to about 10% with the time for 5 to 30 minutes, cleaned by pure water, and then dried in a clean air.

[Formation of a Coating Layer]

Further in the present invention, a step of applying a solution containing at least one element of calcium (Ca), strontium (Sr), and barium (Ba) onto an inner surface of the inner layer 58 can be arranged.

Onto an inner surface of the inner surface part (namely the inner layer 58) of the produced silica container 71 is applied (coated) at least one element of Ca, Sr, and Ba as the crystallization facilitating agent. An aqueous solution or an alcoholic solution of a nitrate salt, a chloride, and a carbonate salt of these Ca, Sr, and Ba is prepared; and it is applied onto inner surface of the inner layer 58 and then dried. It is preferable that the total element concentration of Ca, Sr, and Ba contained therein be in the range from 5 to 500 µg/cm$^2$.

There is a case that this treatment is not executed depending on use of the silica container.

By executing the foregoing steps, the silica container 71 of the present invention as mentioned above and shown in FIG. 2 can be produced.

EXAMPLE

Hereinafter, the present invention will be explained more specifically by showing Examples and Comparative Examples of the present invention; but the present invention is not limited to them.

Example 1

According to the method for producing a silica container of the present invention as shown in FIG. 1, the silica container is produced as following.

Firstly, the first powdered raw material 11 was prepared as following (Step 1).

A natural silica stone (100 kg) was prepared, heated in an air atmosphere at 1000° C. for 10 hours, poured into a pool of pure water, and then cooled quickly. After drying, the stone was crushed by a crusher to make total weight of about 90 kg of the powdered silica (the powdered natural quartz) having particle diameter in the range from 30 to 300 µm and silica purity ($SiO_2$) of 99.999% by weight.

Then, the second powdered raw material 12 was prepared as following (a part of Step 2).

A natural silica stone (about 3 kg) was prepared, heated in an air atmosphere at 1000° C. for 10 hours, poured into a pool of pure water, and then cooled quickly. After drying, the stone was crushed by a crusher. The resulting powders were heat-treated in the atmospheric gas containing hydrogen chloride to obtain total weight about 2 kg of the powdered silica (the powdered natural quartz) having particle diameter in the range from 30 to 300 µm and silica purity ($SiO_2$) of 99.9999% by weight.

As the additive 21 to be added to the second powdered raw material 12, an aqueous aluminum nitrate solution was prepared (a part of Step 2). This was mixed with the second powdered raw material 12 and dried to make the powder mixture 31 (Step 3). Concentration of aluminum in the second powdered raw material 12 was set so as to be 50 ppm by weight.

Then, as shown in FIG. 4, the first powdered raw material 11 was fed to the inner wall 102 of the rotating outer frame 101 with a column-like shape made of carbon, having the aspiration holes 103 formed in its inner wall 102; a shape of the first powdered raw material 11 was adjusted so as to obtain uniform thickness in accordance with the shape of the outer frame 101; in this way, the preliminarily molded substrate 41 was made (Step 4).

Figure 5:
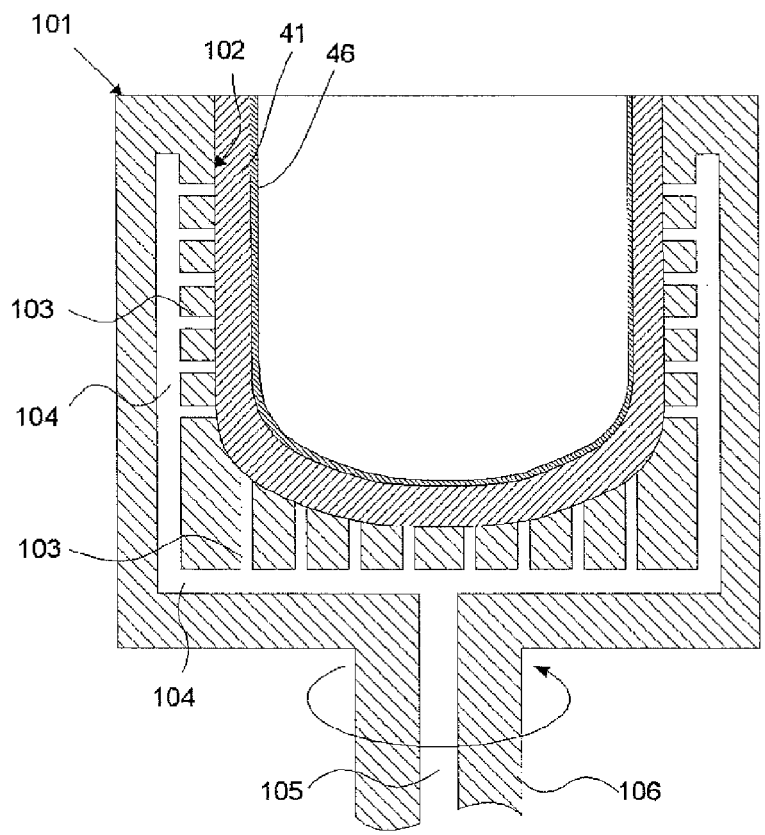
FIG. 5 is a schematic cross section view schematically showing one example of the process step of forming the preliminarily molded intermediate layer in the method for producing a silica container in the present invention.

Then, as shown in FIG. 5, the powder mixture 31 (the second powdered raw material 12 containing the added additive 21) is fed to the inner wall of the preliminarily molded substrate 41, and then the powder mixture 31 was preliminarily molded to the preliminarily molded intermediate layer 46 in such a way as to give uniform thickness in accordance with the inner wall of the preliminarily molded substrate 41 (Step 5).

Then, as shown in FIG. 6 and FIG. 7, the substrate 51 and the intermediate layer 56 were formed by the discharge melting (arc melting) under aspiration (Step 6).

Specifically, the preliminarily molded substrate 41 and the preliminarily molded intermediate layer 46 were degassed by aspiration from the peripheral side of the preliminarily molded substrate 41 through the aspiration holes 103 formed in the outer frame 101, while simultaneously heating from inside of the preliminarily molded substrate 41 and the preliminarily molded intermediate layer 46 at high temperature by the discharge-heat melting method, thereby forming the substrate 51 and the intermediate layer 56 having made the peripheral part of the preliminarily molded substrate 41 to a sintered body while the inner part of the preliminarily molded substrate 41 and the preliminarily molded intermediate layer 46 to the fused glass body. Here, the atmospheric gas of 100% by volume of a nitrogen gas was used.

Figure 8:
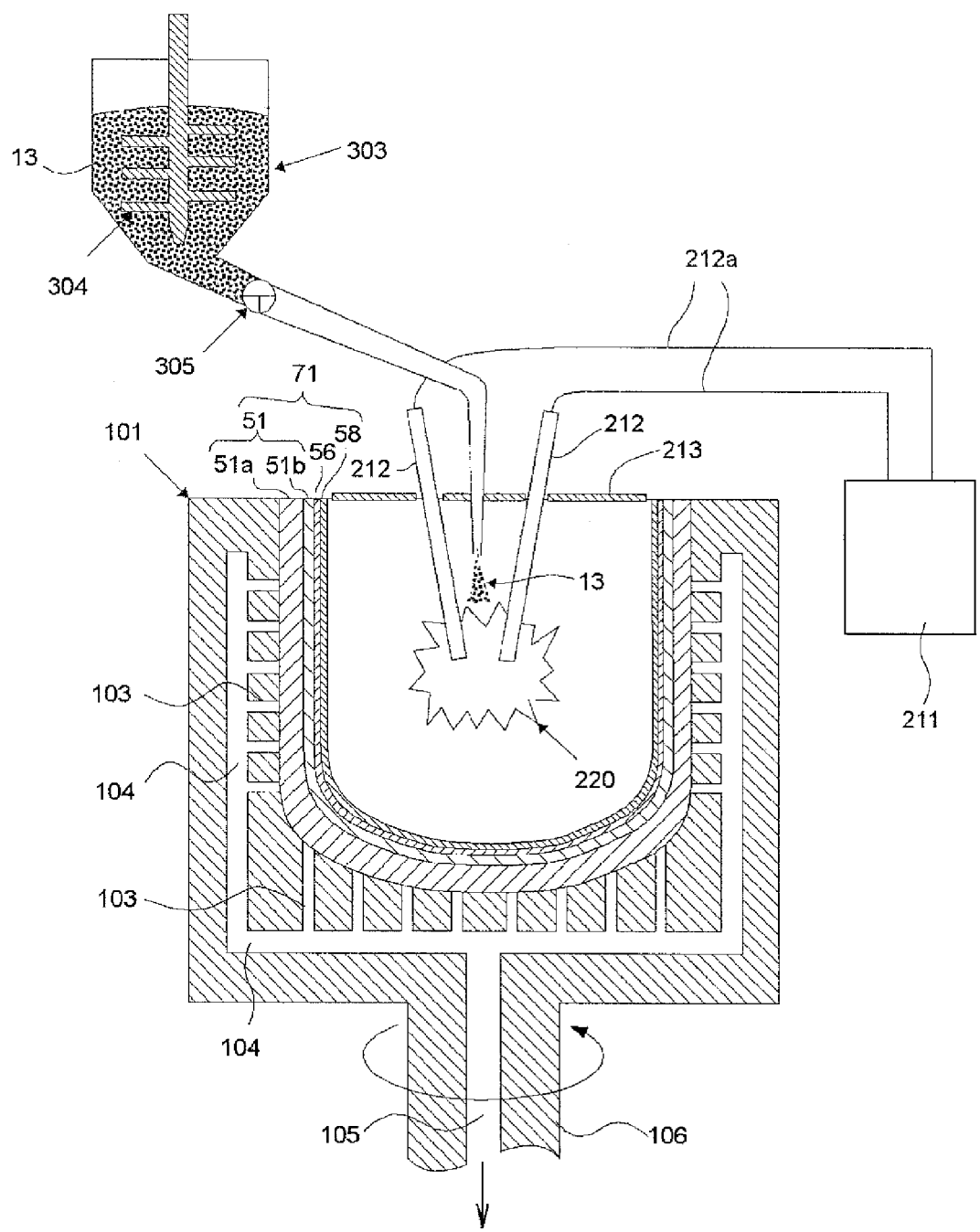
FIG. 8 is a schematic cross section view schematically showing one example of the process step of forming the inner layer in the method for producing a silica container in the present invention.

Then, as shown in FIG. 8, the inner layer 58 was formed by the discharge melting (arc melting) (Step 7).

The carbon electrodes 212 were inserted inside the substrate 51 having the formed intermediate layer 56 in the outer frame 101, and the feeding port of the raw material for forming the inner layer and the cap 213 were arranged. Thereafter, a powdered synthetic cristobalite (particle diameter in the range from 100 to 300 μm, silica purity of 99.99999%) as the third powdered raw material 13 was fed gradually with the discharge-heating (electric arc heating) by the carbon electrodes 212 while the outer frame 101 was rotating. A nitrogen gas containing 5% by volume of a dry oxygen gas (95% by volume of the nitrogen gas concentration) was used as the atmospheric gas.

The silica container 71 thus obtained was washed with 3% by weight of an aqueous solution of hydrogen fluoride (HF) for 3 minutes, rinsed with pure water, and then dried.

Example 2

Basically the same procedures as Example 1 were followed to produce the silica container 71 except for the following changes.

Firstly, aluminum was also added to the first powdered raw material 11 as the additive. The aluminum concentration in the first powdered raw material 11 was made so as to be 50 ppm by weight.

The atmospheric gas in the step of forming the substrate 51 and the intermediate layer 56 from the preliminarily molded substrate 41 and the preliminarily molded intermediate layer 46 (Step 6) was made to a nitrogen gas containing 10% by volume of a hydrogen gas (90% by volume of the nitrogen gas concentration).

Example 3

Basically the same procedures as Example 2 were followed to produce the silica container 71 except for the following changes.

Firstly, a powdered synthetic silica glass (particle diameter in the range from 30 to 300 μm) obtained by the flame hydrolysis method was used as the second powdered raw material 12. The amount of the OH group contained in the intermediate layer 56 was controlled at 200 ppm by weight, which was higher as compared with Examples 1 and 2. The concentration of aluminum added as the additive 21 to the second powdered raw material 12 was made higher to 100 ppm by weight. The atmospheric gas in the step of forming the substrate 51 and the intermediate layer 56 from the preliminarily molded substrate 41 and the preliminarily molded intermediate layer 46 (Step 6) was made to a nitrogen gas containing 5% by volume of a hydrogen gas (95% by volume of the nitrogen gas concentration).

Example 4

Basically the same procedures as Example 3 were followed to produce the silica container 71 except for the following changes.

Firstly, the first powdered raw material 11 was changed to a cheap powdered silica of a low grade (grade with a silica purity ($SiO_2$) of 99.99%).

The amount of the OH group contained in the synthetic silica glass of the second powdered raw material 12 was increased even more as compared with Example 3 so that the amount of the OH group contained in the intermediate layer 56 might become 400 ppm by weight. The concentration of aluminum added as the additive 21 to the second powdered raw material 12 was made to 400 ppm by weight, even higher than Example 3. A powdered natural quartz (particle diameter in the range from 100 to 300 μm and silica purity of 99.9999%) was used as the third powdered raw material 13.

Example 5

Basically the same procedures as Example 1 were followed to produce the silica container 71 except for the following changes.

Firstly, the first powdered raw material 11 was changed to a cheap powdered silica of a low grade (grade with a silica purity ($SiO_2$) of 99.99%, particle diameter in the range from 30 to 300 μm).

The amount of the OH group contained in the intermediate layer 56 was controlled at 50 ppm by weight. As the additive 21 to be added into the second powdered raw material 12, aluminum was added so as to give its concentration of 200 ppm by weight and fine particles of zirconium oxide (crystal nucleating agent) 200 ppm by weight.

The atmospheric gas in the step of forming the substrate 51 and the intermediate layer 46 from the preliminarily molded substrate 41 and the preliminarily molded intermediate layer 46 (Step 6) was made to a nitrogen gas containing 10% by volume of a hydrogen gas (90% by volume of the nitrogen gas concentration). A powdered natural quartz (particle diameter in the range from 100 to 300 μm and silica purity of 99.9999%) was used as the third powdered raw material 13.

A barium chloride solution was applied on the inner surface of the inner layer 58 so as to give the final barium concentration of 100 μg/cm².

Example 6

Basically the same procedures as Example 5 were followed to produce the silica container 71 except for the following changes.

Firstly, the first powdered raw material 11 was changed to a cheap powdered silica of a low grade (grade with a silica purity ($SiO_2$) of 99.99%, particle diameter in the range from 50 to 500 μm).

In to the first powdered raw material 11, magnesium oxide (crystal nucleating agent) was added so as to give its concentration of 50 ppm by weight as the additive.

As the additive 21 to be added into the second powdered raw material 12, aluminum was added so as to give its concentration of 200 ppm by weight, the same as Example 5, while magnesium oxide (crystal nucleating agent) was added so as to give its concentration of 200 ppm by weight in place of zirconium oxide in Example 5.

In addition, a barium chloride solution was applied on the inner surface of the inner layer 58 so as to give the final barium concentration of 300 μg/cm².

Example 7

Basically the same procedures as Example 5 were followed to produce the silica container 71 except for the following changes.

The atmospheric gas in the step of forming the inner layer 58 by the discharge-melting (arc-melting) (Step 7) was made to a nitrogen gas containing 10% by volume of a hydrogen gas (90% by volume of the nitrogen gas concentration). In stead of applying a barium chloride solution onto the inner surface of the inner layer 58, barium nitrate was added to the third powdered raw material 13 so as to give the final barium concentration of 300 ppm by weight in the inner layer 58.

Example 8

The same procedures as Example 7 were followed except that the atmospheric gas in the step of forming the inner layer 58 (Step 7) was made to a nitrogen gas containing 30% by volume of a hydrogen gas (70% by volume of the nitrogen gas concentration) to produce the silica container 71.

Comparative Example 1

According to mostly a conventional method, a silica container (silica crucible) was prepared. Namely, a part corresponding to the substrate of the silica container of the present invention was formed with the discharge-melting (arc melting) by also using a high purity powdered raw material. The layer corresponding to the intermediate layer of the silica container in the present invention was not formed.

Firstly, a high purity powdered natural quartz having silica purity of 99.9999% or higher by weight (particle diameter in the range from 30 to 300 μm) was prepared as the material corresponding to the first powdered raw material.

By using this powdered raw material under an air atmosphere without specific humidity control, this high purity powdered natural quartz was directly fed inside a rotating frame made of carbon by utilizing a centrifugal force to form a powdered quartz layer in the rotating frame; the layer was then discharge-melted by the carbon electrodes to form an outer layer part (corresponding to the substrate 51 of the present invention). Time of this procedure was 60 minutes, and temperature of the outer layer part was estimated to be about 2000° C.

Then, a high purity powdered synthetic cristobalite (particle diameter in the range from 50 to 300 μm) with the silica purity of 99.99999% or higher by weight was prepared as the powdered raw material corresponding to the third powdered raw material; and this high purity powdered synthetic cristobalite was spread from the hopper onto the inner surface of the outer layer part, and then the inner layer part (corresponding to the inner layer 58 in the silica container 71 of the present invention) was formed by the discharge-melting with the carbon electrodes under an air atmosphere without specific humidity control.

Comparative Example 2

With the aim to reduce the production cost of the silica container, the silica container having the outer layer part (corresponding to the substrate 51 of the present invention) formed of a low purity silica and the inner layer part (corresponding to the inner layer 58 of the silica container 71 of the present invention) formed of a high purity silica was produced. Namely, the same procedures as Comparative Example 1 were followed except that a powdered natural quartz with a low purity (a grade of 99.99% silica purity) was used for the powdered silica in the outer layer part. A highly purified powdered natural quartz (particle diameter in the range from 100 to 300 μm, silica purity of 99.9999% by weight) was used for the powdered silica in the inner layer part.

[Evaluation Methods in Examples and Comparative Examples]

Measurements of physical properties and property evaluation of the silica container produced by each Example and Comparative Example were carried out as shown below.

[Analysis of the Impure Metal Element Concentration]

When the impure metal element concentration is relatively low (i.e., high purity), ICP-AES (Inductively Coupled Plasma-Atomic Emission Spectroscopy) or ICP-MS (Inductively Coupled Plasma-Mass Spectroscopy) was used, and when the impure metal element concentration is relatively high (i.e., low purity), AAS (Atomic Absorption Spectroscopy) was used.

[Bulk Density]

Bulk density was measured with an Archimedes method by using a water pool and a precision weighing machine.

[Method for Measuring Particle Diameter of Each Powdered Raw Material]

Two-dimensional shape observation and area measurement of each powdered raw material were carried out with an optical microscope or an electron microscope. Then the diameter was obtained by calculation of the obtained area value with the assumption that shape of the particle is a true circle. This technique was repeated statistically to obtain the range of particle diameter (99% or more by weight of particles are included in this range).

[Thickness Measurement of Each Layer]

The container cross section at the half part of total height of side wall of the silica container was measured by a scale to obtain thickness of the substrate and the inner layer.

[Measurement of Concentration of an OH Group]

The measurement was done with an infrared absorption spectroscopy. Conversion to concentration of an OH group was done according to the following literature:

Dodd, D. M. and Fraser, D. B., (1966), "Optical determination of OH in fused silica", Journal of Applied Physics, vol. 37, p. 3911.

[Method for Measurement of Amount of Gas Molecules Released from Each of the Substrates and the Inner Layers]

Each measurement sample having the size of 10×50 mm with 1 mm thickness and mirror-polished on the both sides was prepared from the part near to inside the substrate (a transparent layer part not having gaseous bubbles) and from the inner layer of each of the silica containers in Examples and Comparative Examples, and then the sample thus obtained was arranged in a vacuum chamber; amount of the released gas by heating at 1000° C. under vacuum was then measured. When amount of the released gas was small, a plurality of measurement samples was simultaneously put inside the sample chamber of the gas measurement instrument to improve the sensitivity of gas detection.

It must be noted here that numbers of released molecules were taken based on the unit surface area for an $O_2$ gas (molecules/cm$^2$), while numbers of released molecules for $H_2$, $H_2O$, $CO$, and $CO_2$ were taken based on the unit volume (molecules/cm$^3$) with the assumption that all molecules were released.

Details of the measurement were followed according to the following literature:

Nasu, S., et al., (1990), "Gas release of various kinds of vitreous silica", Journal of Illuminating Engineering Institute of Japan, vol. 74, No. 9, pp 595 to 600.

It was confirmed that, as to the $H_2$ gas, the same value could also be obtained as the dissolved concentration in silica glass by the measurement method in the following literature.

V. S. Khotimchenko, et al., (1987), "Determining the content of hydrogen dissolved in quartz glass using the methods of Raman scattering and mass spectrometry", Journal of Applied Spectroscopy, Vol. 46, No. 6, pp 632-635.

[Evaluation of Continuous Pulling Up of a Silicon Single Crystal (Multipulling)]

A metal polysilicon with purity of 99.99999% by weight was fed into a produced silica container; thereafter, the temperature was raised to form a silicon melt, and then pulling up of a silicon single crystal was repeated for three times (multipulling). The evaluation was made as the success rate of single crystal growth. The pulling up conditions were: atmosphere of 100% of an argon gas (Ar) with the pressure inside the CZ equipment being $10^3$ Pa, 0.5 mm/minute of the pulling up rate, size of the silicon single crystal with 100 mm in diameter and 200 mm in length. Operation time for one batch was set at about 20 hours. Classification of evaluation based on the success rate of single crystal growth for repetition of three times was made as following:
   three times: good
   two times: fair
   one time: poor

[Prevention Effect of Impurity Diffusion in the Inner Layer of a Silica Container]

A produced silica container after washing and drying was set in an electric furnace having a high purity alumina board as a heat-resistant material and molybdenum disilicate as a heater; and then heat-treatment was carried out under an air atmosphere at 1450° C. for 12 hours. Then, thickness of 100 μm of inner surface part of the container was etched for dissolution by an aqueous solution of 50% hydrogen fluoride (HF); the evaluation was made on whether diffusion of an impure metal element to the inner layer from the substrate with a low silica purity was large or small by analyzing the value of alkali metal element concentration in the etching solution.

Classification based on the total concentration value of Li, Na, and K in the portion of 100 μm thickness of the inner surface was made as following:
   less than 0.1 ppm by weight: good
   0.1 or more ppm by weight to less than 1 ppm by weight: fair
   more than 1 ppm by weight: poor

[Crystallization Effect of Inner Surface of a Silica Container]

A produced silica container after washing and drying was set in an electric furnace having a high purity alumina board as a heat-resistant material and molybdenum disilicate as a heater; and then heat-treatment was carried out under an air atmosphere at 1450° C. for 12 hours. Then, an opacified part by whitening (cristobalite crystal) of inner surface of the silica container was visually checked to evaluate the recrystallization effect. Classification of evaluation on the recrystallization effect was made as following:

80% or more of total inner surface area was opacified by whitening: good
   50% or more to less than 80% of total inner surface area was opacified by whitening: fair
   less than 50% of total inner surface area was opacified by whitening: poor

[Evaluation of Heat-Distortion Resistance of a Silica Container]

In the multipulling of a silicon single crystal as mentioned above, amount of collapse of the side wall upper part of a silica container toward inside thereof after the third pulling up was evaluated as following:
   amount of collapse toward inside was less than 1 cm: good
   amount of collapse toward inside was 1 cm or more and less than 2 cm: fair
   amount of collapse toward inside was 2 cm or more: poor

[Evaluation of (Relative) Production Cost of a Silica Container]

The production cost of the silica container was evaluated. In particular, costs of silica raw materials, a frame and molding, sintering of a preliminarily molded silica article, a melting energy, and the like were summed up for the relative evaluation.
   low cost (less than 30% relative to cost of a conventional method): good
   moderate cost (60 to 30% relative to cost of a conventional method): fair
   high cost (100 to about 60% relative to cost of a conventional method; cost of a conventional method was taken as 100%): poor Production conditions, measured physical properties, and evaluation results of each silica container produced in Examples 1 to 8 and Comparative Examples 1 and 2 are summarized in the following Tables 1 to 5 and Tables 6 to 7. Analysis data of amounts of the released gases from the substrate 51 and analysis data of amounts of the released gases from the inner layer 58 are shown in Table 6; and analysis data of impurity amounts in the inner layer 58 are shown in Table 7.

TABLE 1

| Example No. | | Example 1 | Example 2 |
|---|---|---|---|
| First powdered raw material | | Powdered natural quartz | Powdered natural quartz |
| | | Particle diameter: 30 to 300 μm | Particle diameter: 30 to 300 μm |
| Second powdered raw material | | Powdered natural quartz | Powdered natural quartz |
| | | Particle diameter: 30 to 300 μm | Particle diameter: 30 to 300 μm |
| Additive to the second powdered raw material | | Aluminum nitrate | Aluminum nitrate |
| Third powdered raw material | | Powdered synthetic cristobalite | Powdered synthetic cristobalite |
| | | Particle diameter: 100 to 300 μm | Particle diameter: 100 to 300 μm |
| Additive to the third powdered raw material | | No | No |
| Preliminary molding method of substrate and intermediate layer | | Frame rotation molding method | Frame rotation molding method |
| Heat-melting method of substrate and intermediate layer | | Arc discharge melting with aspiration of inside powders | Arc discharge melting with aspiration of inside powders |
| Atmosphere of heat-melting of substrate and intermediate layer | | $N_2$: 100% by volume | $N_2$: 90% by volume |
| | | | $H_2$: 10% by volume |
| Heat-melting method of inner layer | | Arc discharge melting with powder spreading | Arc discharge melting with powder spreading |
| Atmosphere of heat-melting of inner layer | | $N_2$: 95% by volume | $N_2$: 95% by volume |
| | | $O_2$: 5% by volume | $O_2$: 5% by volume |
| Physical properties of substrate | Color tone | White opaque to transparent | White opaque to transparent |
| | Thickness (mm) | 8 | 8 |
| | Bulk density (g/cm$^3$) | 1.99 to 2.11 | 1.98 to 2.11 |
| | Amount of OH group (ppm by weight) | 30 | 10 |
| | Amount of Al (ppm by weight) | Derived from raw material: 5 | 50 |

TABLE 1-continued

| | Example No. | Example 1 | Example 2 |
|---|---|---|---|
| | Amount of crystal nucleating agent (ppm by weight) | 0 | 0 |
| | Concentration of each Li, Na, K (ppm by weight) | Li: 2, Na: 5, K: 1 | Li: 1, Na: 6, K: 2 |
| Physical properties of intermediate layer | Color tone | Colorless and transparent | Colorless and transparent |
| | Thickness (mm) | 2 | 2 |
| | Bulk density (g/cm$^3$) | 2.20 | 2.20 |
| | Amount of OH group (ppm by weight) | 30 | 30 |
| | Amount of Al (ppm by weight) | 50 | 50 |
| | Amount of crystal nucleating agent (ppm by weight) | 0 | 0 |
| Physical properties of inner layer | Color tone | Colorless and transparent | Colorless and transparent |
| | Thickness (mm) | 3 | 3 |
| | Bulk density (g/cm$^3$) | 2.20 | 2.20 |
| | Amount of OH group (ppm by weight) | 30 | 30 |
| | Inner surface coating layer(μg/cm$^2$) | No | No |
| Evaluation | Continuous Pulling up of silicon single crystal | Fair | Good |
| | Prevention of impurity diffusion | Fair | Fair |
| | Recrystallization | Poor | Poor |
| | Heat distortion resistance | Fair | Fair |
| | Production cost | Fair | Fair |

TABLE 2

| Example No. | Example 3 | Example 4 |
|---|---|---|
| First powdered raw material | Powdered natural quartz Particle diameter: 30 to 300 μm | Powdered natural quartz Particle diameter: 30 to 300 μm |
| Second powdered raw material | Powdered synthetic silica glass Particle diameter: 30 to 300 μm | Powdered synthetic silica glass Particle diameter: 30 to 300 μm |
| Additive to the second powdered raw material | Aluminum nitrate | Aluminum nitrate |
| Third powdered raw material | Powdered synthetic cristobalite Particle diameter: 100 to 300 μm | Powdered natural quartz Particle diameter: 100 to 300 μm |
| Additive to the third powdered raw material | No | No |
| Preliminary molding method of substrate and intermediate layer | Frame rotation molding method | Frame rotation molding method |
| Heat-melting method of substrate and intermediate layer | Arc discharge melting with aspiration of inside powders | Arc discharge melting with aspiration of inside powders |
| Atmosphere of heat-melting of substrate and intermediate layer | N$_2$: 95% by volume H$_2$: 5% by volume | N$_2$: 95% by volume H$_2$: 5% by volume |
| Heat-melting method of inner layer | Arc discharge melting with powder spreading | Arc discharge melting with powder spreading |
| Atmosphere of heat-melting of inner layer | N$_2$: 95% by volume O$_2$: 5% by volume | N$_2$: 95% by volume O$_2$: 5% by volume |
| Physical properties of substrate | Color tone | White opaque to transparent | White opaque to transparent |
| | Thickness (mm) | 8 | 8 |
| | Bulk density (g/cm$^3$) | 1.97 to 2.09 | 1.98 to 2.11 |
| | Amount of OH group (ppm by weight) | 20 | 20 |
| | Amount of Al (ppm by weight) | 50 | 200 |
| | Amount of crystal nucleating agent (ppm by weight) | 0 | 0 |
| | Concentration of each Li, Na, K (ppm by weight) | Li: 1, Na: 5, K: 2 | Li: 5, Na: 40, K: 15 |
| Physical properties of intermediate layer | Color tone | Colorless and transparent | Colorless and transparent |
| | Thickness (mm) | 2 | 2 |
| | Bulk density (g/cm$^3$) | 2.20 | 2.20 |
| | Amount of OH group (ppm by weight) | 200 | 400 |
| | Amount of Al (ppm by weight) | 100 | 400 |
| | Amount of crystal nucleating agent (ppm by weight) | 0 | 0 |
| Physical properties of inner layer | Color tone | Colorless and transparent | Colorless and transparent |
| | Thickness (mm) | 3 | 3 |
| | Bulk density (g/cm$^3$) | 2.20 | 2.20 |
| | Amount of OH group (ppm by weight) | 20 | 20 |
| | Inner surface coating layer(μg/cm$^2$) | No | No |

TABLE 2-continued

| | Example No. | Example 3 | Example 4 |
|---|---|---|---|
| Evaluation | Continuous Pulling up of silicon single crystal | Good | Good |
| | Prevention of impurity diffusion | Good | Fair |
| | Recrystallization | Poor | Poor |
| | Heat distortion resistance | Fair | Good |
| | Production cost | Fair | Good |

TABLE 3

| Example No. | | Example 5 | Example 6 |
|---|---|---|---|
| First powdered raw material | | Powdered natural quartz Particle diameter: 30 to 300 μm | Powdered natural quartz Particle diameter: 30 to 500 μm |
| Second powdered raw material | | Powdered natural quartz Particle diameter: 30 to 300 μm | Powdered natural quartz Particle diameter: 30 to 300 μm |
| Additive to the second powdered raw material | | Aluminum nitrate | Aluminum nitrate |
| Third powdered raw material | | Powdered natural quartz Particle diameter: 100 to 300 μm | Powdered natural quartz Particle diameter: 100 to 300 μm |
| Additive to the third powdered raw material | | No | No |
| Preliminary molding method of substrate and intermediate layer | | Frame rotation molding method | Frame rotation molding method |
| Heat-melting method of substrate and intermediate layer | | Arc discharge melting with aspiration of inside powders | Arc discharge melting with aspiration of inside powders |
| Atmosphere of heat-melting of substrate and intermediate layer | | $N_2$: 90% by volume $H_2$: 10% by volume | $N_2$: 90% by volume $H_2$: 10% by volume |
| Heat-melting method of inner layer | | Arc discharge melting with powder spreading | Arc discharge melting with powder spreading |
| Atmosphere of heat-melting of inner layer | | $N_2$: 95% by volume, $O_2$: 5% by volume | $N_2$: 95% by volume, $O_2$: 5% by volume |
| Physical properties of substrate | Color tone | White opaque to transparent | White opaque to transparent |
| | Thickness (mm) | 8 | 8 |
| | Bulk density (g/cm³) | 1.99 to 2.10 | 1.97 to 2.09 |
| | Amount of OH group (ppm by weight) | 10 | 10 |
| | Amount of Al (ppm by weight) | Derived from raw material: 6 | Derived from raw material: 7 |
| | Amount of crystal nucleating agent (ppm by weight) | 0 | MgO: 50 |
| | Concentration of each Li, Na, K (ppm by weight) | Li: 5, Na: 30, K: 10 | Li: 5, Na: 50, K: 20 |
| Physical properties of intermediate layer | Color tone | White and semitransparent | Colorless and transparent |
| | Thickness (mm) | 3 | 3 |
| | Bulk density (g/cm³) | 2.19 | 2.19 |
| | Amount of OH group (ppm by weight) | 50 | 60 |
| | Amount of Al (ppm by weight) | 200 | 200 |
| | Amount of crystal nucleating agent (ppm by weight) | $ZrO_2$: 200 | MgO: 200 |
| Physical properties of inner layer | Color tone | Colorless and transparent | Colorless and transparent |
| | Thickness (mm) | 3 | 3 |
| | Bulk density (g/cm³) | 2.20 | 2.20 |
| | Amount of OH group (ppm by weight) | 30 | 30 |
| | Inner surface coating layer(μg/cm²) | Ba: 100 | Ba: 300 |
| Evaluation | Continuous Pulling up of silicon single crystal | Good | Good |
| | Prevention of impurity diffusion | Fair | Fair |
| | Recrystallization | Fair | Good |
| | Heat distortion resistance | Good | Good |
| | Production cost | Good | Good |

TABLE 4

| Example No. | Example 7 | Example 8 |
|---|---|---|
| First powdered raw material | Powdered natural quartz Particle diameter: 30 to 300 μm | Powdered natural quartz Particle diameter: 50 to 500 μm |
| Second powdered raw material | Powdered natural quartz Particle diameter: 30 to 300 μm | Powdered natural quartz Particle diameter: 30 to 300 μm |

TABLE 4-continued

| Example No. | | Example 7 | Example 8 |
|---|---|---|---|
| Additive to the second powdered raw material | | Aluminum nitrate | Aluminum nitrate |
| Third powdered raw material | | Powdered natural quartz Particle diameter: 100 to 300 μm | Powdered natural quartz Particle diameter: 100 to 300 μm |
| Additive to the third powdered raw material | | Barium nitrate | Barium nitrate |
| Preliminary molding method of substrate and intermediate layer | | Frame rotation molding method | Frame rotation molding method |
| Heat-melting method of substrate and intermediate layer | | Arc discharge melting with aspiration of inside powders | Arc discharge melting with aspiration of inside powders |
| Atmosphere of heat-melting of substrate and intermediate layer | | $N_2$: 90% by volume $H_2$: 10% by volume | $N_2$: 90% by volume $H_2$: 10% by volume |
| Heat-melting method of inner layer | | Arc discharge melting with powder spreading | Arc discharge melting with powder spreading |
| Atmosphere of heat-melting of inner layer | | $N_2$: 90% by volume, $H_2$: 10% by volume | $N_2$: 70% by volume, $H_2$: 30% by volume |
| Physical properties of substrate | Color tone | White opaque to transparent | White opaque to transparent |
| | Thickness (mm) | 8 | 8 |
| | Bulk density (g/cm$^3$) | 1.99 to 2.11 | 1.97 to 2.11 |
| | Amount of OH group (ppm by weight) | 10 | 10 |
| | Amount of Al (ppm by weight) | Derived from raw material: 6 | Derived from raw material: 7 |
| | Amount of crystal nucleating agent (ppm by weight) | 0 | 0 |
| | Concentration of each Li, Na, K (ppm by weight) | Li: 5, Na: 40, K: 10 | Li: 5, Na: 45, K: 20 |
| Physical properties of intermediate layer | Color tone | White and semitransparent | White and semitransparent |
| | Thickness (mm) | 3 | 3 |
| | Bulk density (g/cm$^3$) | 2.19 | 2.19 |
| | Amount of OH group (ppm by weight) | 50 | 200 |
| | Amount of Al (ppm by weight) | 200 | 200 |
| | Amount of crystal nucleating agent (ppm by weight) | $ZrO_2$: 200 | $ZrO_2$: 200 |
| Physical properties of inner layer | Color tone | Colorless and transparent | Colorless and transparent |
| | Thickness (mm) | 3 | 3 |
| | Bulk density (g/cm$^3$) | 2.20 | 2.20 |
| | Amount of OH group (ppm by weight) | 15 | 10 |
| | Inner surface coating layer(μg/cm$^2$) | No (dope concentration: Ba 300 ppm by weight) | No (dope concentration: Ba 300 ppm by weight) |
| Evaluation | Continuous Pulling up of silicon single crystal | Good | Good |
| | Prevention of impurity diffusion | Fair | Good |
| | Recrystallization | Good | Good |
| | Heat distortion resistance | Good | Good |
| | Production cost | Good | Good |

TABLE 5

| Example No. | | Comparative Example 1 | Comparative Example 2 |
|---|---|---|---|
| First powdered raw material | | Powdered natural quartz Particle diameter: 30 to 300 μm | Powdered natural quartz Particle diameter: 30 to 300 μm |
| Second powdered raw material | | No | No |
| Additive to the second powdered raw material | | — | — |
| Third powdered raw material | | Powdered synthetic cristobalite Particle diameter: 50 to 300 μm | Powdered natural quartz Particle diameter: 100 to 300 μm |
| Additive to the third powdered raw material | | No | No |
| Preliminary molding method of substrate and intermediate layer | | Frame rotation molding method | Frame rotation molding method |
| Heat-melting method of substrate and intermediate layer | | Arc discharge melting under normal pressure | Arc discharge melting under normal pressure |
| Atmosphere of heat-melting of substrate and intermediate layer | | $N_2$: 80% by volume $O_2$: 20% by volume (air) | $N_2$: 80% by volume $O_2$: 20% by volume (air) |
| Heat-melting method of inner layer | | Arc discharge melting with powder spreading | Arc discharge melting with powder spreading |
| Atmosphere of heat-melting of inner layer | | $N_2$: 80% by volume $O_2$: 20% by volume (air) | $N_2$: 30% by volume, $O_2$: 20% by volume (air) |
| Physical properties of substrate | Color tone | White and opaque | White and opaque |
| | Thickness (mm) | 10 | 10 |
| | Bulk density (g/cm$^3$) | 2.05 | 2.02 |
| | Amount of OH group (ppm by weight) | 90 | 40 |

TABLE 5-continued

| | Example No. | Comparative Example 1 | Comparative Example 2 |
|---|---|---|---|
| | Amount of Al (ppm by weight) | Derived from raw material: 3 | Derived from raw material: 6 |
| | Amount of crystal nucleating agent (ppm by weight) | 0 | 0 |
| | Concentration of each Li, Na, K (ppm by weight) | Li: 0.1, Na: 0.5, K: 0.2 | Li: 5, Na: 50, K: 18 |
| Physical properties of intermediate layer | Color tone | — | — |
| | Thickness (mm) | — | — |
| | Bulk density (g/cm$^3$) | — | — |
| | Amount of OH group (ppm by weight) | — | — |
| | Amount of Al (ppm by weight) | — | — |
| | Amount of crystal nucleating agent (ppm by weight) | — | — |
| Physical properties of inner layer | Color tone | Colorless and transparent | Colorless and transparent |
| | Thickness (mm) | 3 | 3 |
| | Bulk density (g/cm$^3$) | 2.20 | 2.20 |
| | Amount of OH group (ppm by weight) | 200 | 200 |
| | Inner surface coating layer(μg/cm$^2$) | No | No |
| Evaluation | Continuous Pulling up of silicon single crystal | Fair | Poor |
| | Prevention of impurity diffusion | Good | Poor |
| | Recrystallization | Poor | Poor |
| | Heat distortion resistance | Fair | Fair |
| | Production cost | Poor | Good |

TABLE 6

| | | Example 1 | Example 2 | Example 3 | Example 4 | Example 5 |
|---|---|---|---|---|---|---|
| Released gas amount from substrate | H$_2$ (molecules/cm$^3$) | <5 × 10$^{15}$ | 3 × 10$^{16}$ | 5 × 10$^{15}$ | 5 × 10$^{15}$ | 1 × 10$^{16}$ |
| | O$_2$ (molecules/cm$^2$) | 1 × 10$^{15}$ | <1 × 10$^{15}$ | <1 × 10$^{15}$ | <1 × 10$^{15}$ | <1 × 10$^{15}$ |
| | H$_2$O (molecules/cm$^3$) | 1 × 10$^{17}$ | 2 × 10$^{16}$ | 3 × 10$^{16}$ | 3 × 10$^{16}$ | 2 × 10$^{16}$ |
| | CO (molecules/cm$^3$) | <1 × 10$^{16}$ | <1 × 10$^{16}$ | <1 × 10$^{16}$ | <1 × 10$^{16}$ | <1 × 10$^{16}$ |
| | CO$_2$ (molecules cm$^3$) | <1 × 10$^{16}$ | <1 × 10$^{16}$ | <1 × 10$^{16}$ | <1 × 10$^{16}$ | <1 × 10$^{16}$ |
| Released gas amount from inner layer | H$_2$ (molecules/cm$^3$) | <5 × 10$^{15}$ | <5 × 10$^{15}$ | <5 × 10$^{15}$ | <5 × 10$^{15}$ | <5 × 10$^{15}$ |
| | O$_2$ (molecules/cm$^2$) | <1 × 10$^{15}$ | <1 × 10$^{15}$ | 1 × 10$^{15}$ | 1 × 10$^{15}$ | <1 × 10$^{15}$ |
| | H$_2$O (molecules/cm$^3$) | 2 × 10$^{17}$ | 5 × 10$^{16}$ | 5 × 10$^{16}$ | 5 × 10$^{16}$ | 3 × 10$^{16}$ |
| | CO (molecules/cm$^3$) | 5 × 10$^{16}$ | 3 × 10$^{16}$ | 4 × 10$^{16}$ | 2 × 10$^{16}$ | 3 × 10$^{16}$ |
| | CO$_2$ (molecules/cm$^3$) | <1 × 10$^{16}$ | <1 × 10$^{16}$ | 1 × 10$^{16}$ | 1 × 10$^{16}$ | 1 × 10$^{16}$ |

| | | Example 6 | Example 7 | Example 8 | Comparative Example 1 | Comparative Example 2 |
|---|---|---|---|---|---|---|
| Released gas amount from substrate | H$_2$ (molecules/cm$^3$) | 8 × 10$^{15}$ | 1 × 10$^{16}$ | 1 × 10$^{16}$ | <5 × 10$^{15}$ | <5 × 10$^{15}$ |
| | O$_2$ (molecules/cm$^2$) | <1 × 10$^{15}$ | <1 × 10$^{15}$ | <1 × 10$^{15}$ | 2 × 10$^{15}$ | 2 × 10$^{15}$ |
| | H$_2$O (molecules/cm$^3$) | 2 × 10$^{16}$ | 3 × 10$^{16}$ | 3 × 10$^{16}$ | 6 × 10$^{17}$ | 7 × 10$^{17}$ |

TABLE 6-continued

|  |  |  |  |  |  |  |
|---|---|---|---|---|---|---|
|  | CO (molecules/cm³) | $<1 \times 10^{16}$ | $<1 \times 10^{16}$ | $<1 \times 10^{16}$ | $8 \times 10^{16}$ | $7 \times 10^{16}$ |
|  | $CO_2$ (molecules cm³) | $<1 \times 10^{16}$ | $<1 \times 10^{16}$ | $<1 \times 10^{16}$ | $2 \times 10^{16}$ | $3 \times 10^{16}$ |
| Released gas amount from inner layer | $H_2$ (molecules/cm³) | $<5 \times 10^{15}$ | $<5 \times 10^{15}$ | $<5 \times 10^{15}$ | $<5 \times 10^{15}$ | $<5 \times 10^{15}$ |
|  | $O_2$ (molecules/cm²) | $<1 \times 10^{15}$ | $<1 \times 10^{15}$ | $<1 \times 10^{15}$ | $2 \times 10^{15}$ | $2 \times 10^{15}$ |
|  | $H_2O$ (molecules/cm³) | $3 \times 10^{16}$ | $<1 \times 10^{16}$ | $<1 \times 10^{16}$ | $7 \times 10^{17}$ | $8 \times 10^{17}$ |
|  | CO (molecules/cm³) | $3 \times 10^{16}$ | $<1 \times 10^{16}$ | $<1 \times 10^{16}$ | $1 \times 10^{17}$ | $2 \times 10^{17}$ |
|  | $CO_2$ (molecules/cm³) | $1 \times 10^{16}$ | $<1 \times 10^{16}$ | $<1 \times 10^{16}$ | $3 \times 10^{16}$ | $2 \times 10^{16}$ |

TABLE 7

| Element | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|
| Li | 1 | 2 | 1 | 10 | 10 | 10 | 5 | 7 | 3 | 25 |
| Na | 10 | 8 | 9 | 45 | 45 | 50 | 50 | 52 | 10 | 70 |
| K | 3 | 3 | 2 | 20 | 15 | 20 | 12 | 14 | 5 | 30 |
| Ti | 2 | 3 | 2 | 10 | 10 | 10 | 9 | 9 | 2 | 20 |
| V | <1 | <1 | <1 | 1 | 2 | 2 | 1 | 2 | <1 | 2 |
| Cr | 2 | 2 | 1 | 3 | 3 | 5 | 3 | 5 | 3 | 5 |
| Mn | <1 | <1 | <1 | 4 | 5 | 5 | 3 | 2 | <1 | 2 |
| Fe | 8 | 7 | 6 | 25 | 30 | 30 | 25 | 20 | 3 | 40 |
| Co | <1 | <1 | <1 | 2 | 3 | 3 | 2 | 1 | <1 | 1 |
| Ni | 2 | 3 | 3 | 10 | 10 | 15 | 12 | 10 | 3 | 30 |
| Cu | 2 | 5 | 4 | 15 | 20 | 20 | 15 | 10 | 2 | 30 |
| Zn | <1 | 1 | 1 | 2 | 2 | 3 | 2 | 3 | 2 | 12 |
| Zr | <1 | <1 | <1 | 3 | 4 | 4 | 5 | 3 | <1 | 15 |
| Mo | 1 | 1 | 1 | 2 | 3 | 2 | 3 | 2 | 1 | 2 |
| Ta | <1 | 1 | <1 | 2 | 2 | 3 | 2 | 3 | 1 | 3 |
| W | 1 | 1 | <1 | 3 | 2 | 2 | 3 | 5 | 1 | 5 |

As can be seen in Tables 1 to 7, in Examples 1 to 8 which were in accord with the method for producing a silica container of the present invention, a silica container giving the results in pulling up of a single crystal no way inferior to a conventional silica container of Comparative Example 1 could be obtained, even though a low purity powdered silica available more cheaply and with a higher productivity as compared with Comparative Example 1 was used.

In addition, in Examples 1 to 8, the amount of an $H_2O$ molecule (water) was extraordinary lower, giving less defects such as a void and a pinhole in the silicon single crystal produced by using the silica container thereof, as compared with Comparative Examples 1 and 2.

In Example 2, the atmospheric gas in the step of forming the substrate 51 and the intermediate layer 56 from the preliminarily molded substrate 41 and the preliminarily molded intermediate layer 46 (Step 6) was made to a nitrogen gas containing 10% by volume of a hydrogen gas; and because of this the released amount of an $H_2O$ gas in the substrate could be reduced as compared with Example 1.

In Example 3, in which concentrations of an OH group and aluminum in the intermediate layer 56 was increased, a higher prevention effect of impurity diffusion as compared with Example 1 and Example 2 could be obtained.

In Example 4, a cheap powdered silica with a low purity (silica purity of 99.99% by weight) was used as the first powdered raw material 11 for the substrate 51; but the impurity prevention effect could be satisfactorily enhanced by increasing concentrations of an OH group and aluminum in the intermediate layer 56. As a result, the total cost of raw materials could be made low, and yet the silica container having satisfactory properties could be produced with a low cost.

In Example 5, as in Example 4, the first powdered raw material 11 for the substrate 51 was made to a low cost powdered silica with a low purity (silica purity of 99.99%); in spite of that, the impurity prevention effect could be enhanced still higher by combination of three factors: the OH concentration, the aluminum concentration, and the crystal nucleating agent. In addition, by applying the barium solution on an inner surface of the inner layer 58, the recrystallization ratio of the inner surface could be increased; thus the etching resistance could be improved.

In Example 6, the barium concentration applied to the inner surface of the inner layer 58 was made still higher as compared with Example 5, resulting in increase of the etching resistance.

In Examples 7 and 8, the atmospheric gas was made to an nitrogen gas containing a hydrogen gas in the step of forming the inner layer 58 by the discharge-melting (arc-melting) (Step 7), thereby enabling to reduce the dissolved gas amounts of an $H_2O$ molecule and an $O_2$ molecule, particularly effectively an $H_2O$ molecule, among the gases dissolved in the silica container.

In comparative Example 2, the outer layer part (corresponding to the substrate 51 of the present invention) was made of a low purity silica with an aim to reduce production cost of the silica container; but in this case, diffusion of impurities to the inner surface part of the silica container was large and the released gas amount was large.

It must be noted here that the present invention is not limited to the embodiments as described above. The foregoing embodiments are mere examples; any form having substantially the same composition as the technical concept described in claims of the present invention and showing similar effects is included in the technical scope of the present invention.

The invention claimed is:

1. A method for producing a silica container comprising at least a substrate comprised of a silica as its main component and having a rotational symmetry, an intermediate layer formed on an inner wall of the substrate, and an inner layer formed on an inner wall of the intermediate layer, wherein the method comprises:
   a step of preparing a first powdered raw material comprising silica particles, for forming the substrate,
   a step of adding, as an additive, at least any one of an aluminum compound and a powdered compound capable of becoming a crystal nucleating agent for crystallization of a silica glass, into a second powdered raw material comprising silica particles, for forming the intermediate layer,
   a step of forming a preliminarily molded substrate, wherein the first powdered raw material is fed to an inner wall of an outer frame having a rotational symmetry and aspiration holes arranged in the inner wall while rotating the outer frame thereby preliminarily molding to an intended shape in accordance with the inner wall of the outer frame,
   a step of forming a preliminarily molded intermediate layer, wherein the second powdered raw material added with the additive is fed to an inner wall of the preliminarily molded substrate thereby preliminarily molding to an intended shape in accordance with the inner wall of the preliminarily molded substrate,
   a step of forming the substrate and the intermediate layer, wherein the preliminarily molded substrate and the preliminarily molded intermediate layer are degassed by aspiration from an outer side of the preliminarily molded substrate through the aspiration holes formed in the outer frame and at the same time heated from inside the preliminarily molded substrate and the preliminarily molded intermediate layer by a discharge-heat melting method thereby forming an outer part of the preliminarily molded substrate into a sintered body constituting an outer portion of the substrate while forming an inner part of the preliminarily molded substrate into a fused glass body constituting an inner portion of the substrate, and forming the preliminarily molded intermediate layer into a fused glass body constituting the intermediate layer, and
   a step of forming the inner layer on an inner surface of the intermediate layer, wherein a third powdered raw material comprised of a crystalline silica and having a higher silica purity than the first powdered raw material is spread from inside the substrate on which the intermediate layer was formed and at the same time heated from the inside by a discharge-heat melting method.

2. The method for producing a silica container according to claim 1, wherein an atmospheric gas in the step of forming the substrate and the intermediate layer from the preliminarily molded substrate and the preliminarily molded intermediate layer is a gas mixture comprised of an inert gas as its main component and 1% or more by volume of an $H_2$ gas.

3. The method for producing a silica container according to claim 1, wherein an atmospheric gas in the step of forming the inner layer is a gas mixture comprised of an inert gas as its main component and an $O_2$ gas in the range from 1 to 30% by volume.

4. The method for producing a silica container according to claim 1, wherein an atmospheric gas in the step of forming the inner layer is a gas mixture comprised of an inert gas as its main component and an $H_2$ gas in a range from 1 to 30% by volume.

5. The method for producing a silica container according to claim 1, wherein a silica purity of the first powdered raw material is in a range from 99.9 to 99.999% by weight.

6. The method for producing a silica container according to claim 1, further comprising a step of adding at least one element of Ca, Sr, and Ba into the third powdered raw material with a total element concentration of Ca, Sr, and Ba contained therein being in a range from 50 to 5000 ppm by weight.

7. The method for producing a silica container according to claim 1, further comprising a step of forming a coating layer containing at least one element of Ca, Sr, and Ba on an inner surface side of the inner layer with a total element concentration of Ca, Sr, and Ba contained in the coating layer being in a range from 5 to 500 μg/cm$^2$.

8. The method for producing a silica container according to claim 1, wherein the silica container is used as a crucible for pulling up of a silicon single crystal.

* * * * *